(12) United States Patent
Lisherness et al.

(10) Patent No.: US 12,061,855 B2
(45) Date of Patent: Aug. 13, 2024

(54) FUNCTIONAL CIRCUIT BLOCK HARVESTING IN INTEGRATED CIRCUITS

(71) Applicant: Apple Inc., Cupertino, CA (US)

(72) Inventors: Peter A. Lisherness, Los Gatos, CA (US); Lior Zimet, Kerem Maharal (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/471,083

(22) Filed: Sep. 20, 2023

(65) Prior Publication Data

US 2024/0104280 A1 Mar. 28, 2024

Related U.S. Application Data

(60) Provisional application No. 63/376,682, filed on Sep. 22, 2022.

(51) Int. Cl.
*G06F 30/347* (2020.01)
(52) U.S. Cl.
CPC .................. *G06F 30/347* (2020.01)
(58) Field of Classification Search
USPC .......................................................... 716/117
See application file for complete search history.

(56) References Cited

U.S. PATENT DOCUMENTS

| | | | |
|---|---|---|---|
| 8,732,644 | B1 | 5/2014 | Diamond |
| 11,049,013 | B1* | 6/2021 | Duong ............... G06N 3/08 |
| 2006/0119384 | A1 | 6/2006 | Camarota et al. |
| 2015/0205751 | A1 | 7/2015 | Oh et al. |
| 2016/0188348 | A1 | 6/2016 | Hung et al. |
| 2018/0132056 | A1* | 5/2018 | Leedy ............... H01L 29/78648 |
| 2019/0250969 | A1* | 8/2019 | Tan ..................... G06F 11/0772 |
| 2019/0392287 | A1* | 12/2019 | Ovsiannikov ......... G06F 17/153 |
| 2021/0312057 | A1* | 10/2021 | Kloth ..................... G06F 3/0623 |

FOREIGN PATENT DOCUMENTS

WO 2005/029329 A1 3/2005

OTHER PUBLICATIONS

International Search Report and Written Opinion in PCT Appl. No. PCT/US2023/033351 mailed Jan. 5, 2024, 10 pages.

* cited by examiner

*Primary Examiner* — Mohammed Alam
(74) *Attorney, Agent, or Firm* — Kowert, Hood, Munyon, Rankin & Goetzel, P.C.; Dean M. Munyon

(57) ABSTRACT

An integrated circuit (IC) configurable for use in one of a number of possible platforms is disclosed. The IC includes a number of different functional circuit blocks and a plurality of programmable register. The programmable registers, when programmed, can cause corresponding functional circuit blocks to be fully or partially disabled. The different platforms support different sets of peripherals. The IC is thus configured, using the programmable registers, for use in a particular platform to support its corresponding set of peripherals, while another instance of the IC may be configured for use in another platform, supporting its particular set of peripherals.

20 Claims, 14 Drawing Sheets

| Product | CPU Complex | GPU Complex | ISP/Camera | External Display | Internal Display | MCC |
|---|---|---|---|---|---|---|
| Tablet | Full | Full | Full | Full | Full | Full |
| Phone High | Full | Full | Full | Disabled | Full | Full |
| Phone Mid | Partial | Full | Partial | Disabled | Full | Partial |
| Phone Entry | Partial | Partial | Partial | Disabled | Partial | Partial |
| Desktop PC High | Full | Full | Disabled | Full | Disabled | Full |
| Desktop PC Mid | Partial | Partial | Disabled | Full | Disabled | Partial |
| Set Top Box | Partial | Partial | Disabled | Full | Disabled | Partial |
| Monitor/TV | Partial | Partial | Disabled | Full | Full | Partial |
| Laptop PC | Partial | Partial | Disabled | Full | Full | Partial |

Fig. 5

FUNCTIONAL CIRCUIT BLOCK HARVESTING IN INTEGRATED CIRCUITS

PRIORITY INFORMATION

The present application claims priority to U.S. Provisional Patent Application 63/376,682, entitled "Functional Circuit Block Harvesting in Integrated Circuits," filed Sep. 22, 2022, and which is herein incorporated by reference in full.

BACKGROUND

Technical Field

This disclosure is directed to integrated circuits, and more particularly, to integrated circuits with configurable functionality.

Description of the Related Art

As features sizes have decreased, the amount of functionality that can be implemented on an integrated circuit (IC) has increased correspondingly. Thus, many functions that would have previously been placed on multiple IC dies may now be incorporated into a single IC. Moreover, the level of integration on ICs has increased to the point that entire systems, known as SoCs, may be incorporated onto a single IC. An SoC may incorporate various functional circuit blocks, such as processor cores, graphics processors, memory controllers, image system processing circuitry, various types of input/output (I/O) circuits including circuit blocks that support various types of wired I/O (e.g., high speed serial links) as well as circuit blocks that support radio frequency communications, among others.

SoCs are used in a wide variety of systems. Some systems which utilize SoCs include smartwatches, mobile devices (e.g., smartphones, tablet computers), television set top boxes, desktop computers, servers, and so on. These various systems may utilize corresponding SoCs that incorporate levels of functionality in accordance with the needs of their particular application.

SUMMARY

The present disclosure is directed to an IC that can be configured for use in any of a number of different platforms. In one embodiment, an integrated circuit (IC) includes a set of processing blocks for a computer system that includes a central processing unit (CPU) circuit block, a graphics processing unit (GPU) circuit block, and one or more other circuit blocks. The IC includes a set of programmable registers associated with ones of the set of processing blocks, wherein the IC is configured to, when a given one of the set of programmable registers is set, disable a portion of a given one of the set of processing blocks. Processing blocks in the set of processing blocks are configured to be at least partially disabled by setting ones of the set of programmable registers, such that the IC is configurable for use in different computing platforms by partially or fully disabling different combinations of the set of processing blocks. At least two of the different computing platforms support different sets of peripherals.

In one embodiment, a method includes testing an IC having a plurality of functional circuit blocks, and determining, based on the testing, that one or more of the plurality of functional circuit blocks on the IC are incapable of performing their intended function. The method further includes programming one or more of the programmable registers corresponding to the one or more of the plurality of functional circuit blocks determined to be incapable of performing their intended function. As a result of the programming, cause corresponding ones of a plurality of power switches may be configured (e.g., opened) such that power is not provided to their corresponding ones of the plurality of functional circuit blocks. Subsequently, the method includes programming additional ones of the programmable registers to inhibit power from being provided to corresponding ones of the functional circuit blocks, thus disabling these functional circuit blocks in accordance with a selected computing platform.

The present disclosure further contemplates a computer system having a set of processing blocks, wherein the computer system includes a set of programmable registers, wherein a given one of the programmable registers corresponds to at least one of the set of processing blocks. The computer system is configured to receive a harvesting command that writes a disable value to a group of one or more of the programmable registers, the group of programmable registers corresponding to a group of the set of processing blocks that are to be disabled for a selected computing platform of a plurality of different computing platforms for which the computer system can be configured. The computer system further includes one or more hardware circuits configured to perform one or more tasks after a given boot of the computer system, wherein the one or more tasks utilize circuitry in at least one of the group of the set of processing blocks. A power control circuit is configured, after the one or more tasks have been performed, to temporarily disable the group of the set of processing blocks, thereby configuring the computer system for the selected computing platform.

BRIEF DESCRIPTION OF THE DRAWINGS

The following detailed description makes reference to the accompanying drawings, which are now briefly described.

FIG. 5 is a diagram of a product matrix illustrating the use of a particular design of an IC/SoC in different platforms.

DETAILED DESCRIPTION OF EMBODIMENTS

Figure 1:
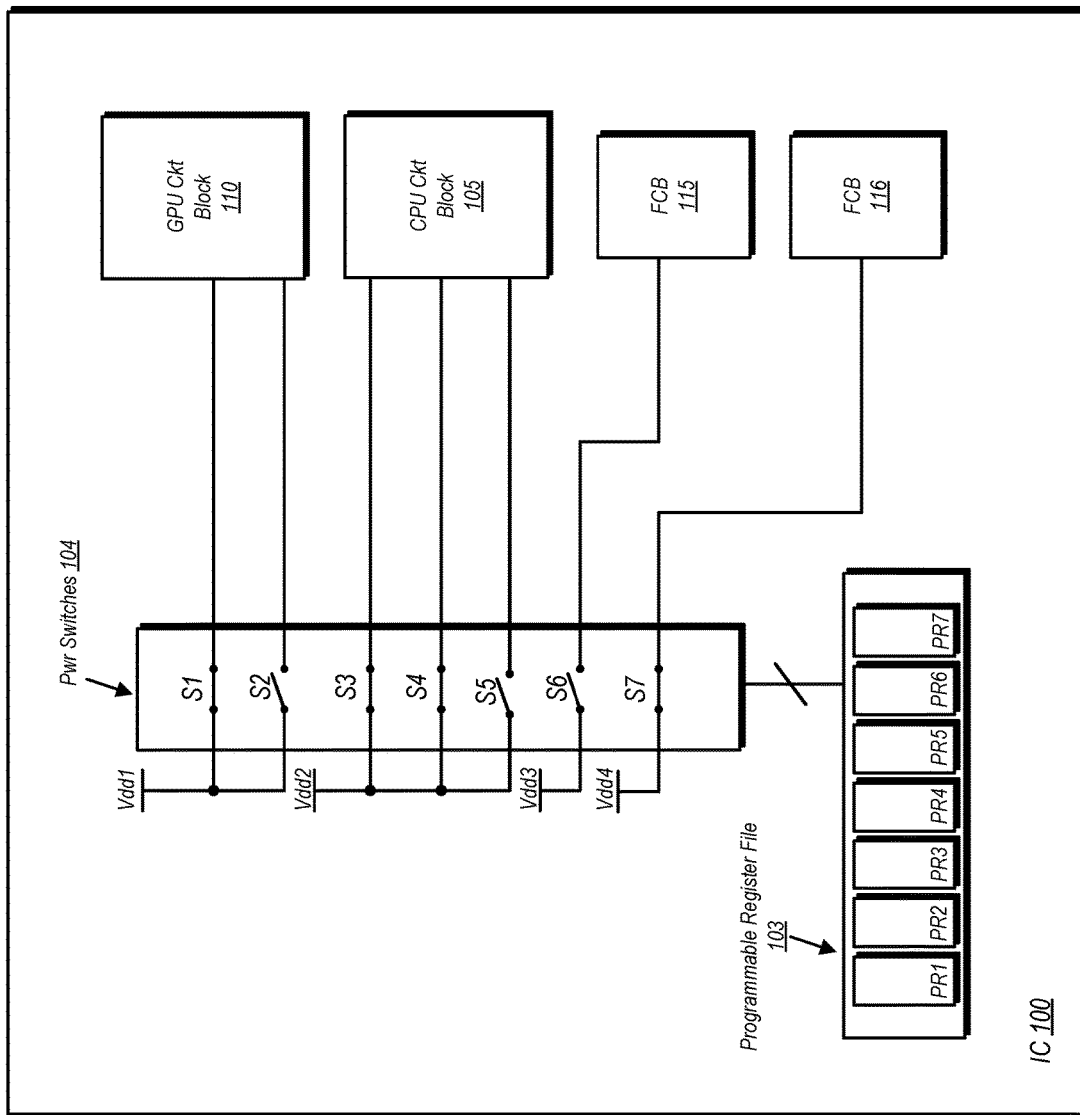
FIG. 1 is a block diagram of one embodiment of an integrated circuit (IC).

The present disclosure is directed to various methods for configuring an SoC (and more generally, an IC) in accordance with a particular system/computing platform in which it is to be used. SoCs can be manufactured to incorporate a wide variety of different functions. Furthermore, companies that manufacture various electronic devices may sometimes employ a common SoC architecture across a wide variety of platforms. For example, a common SoC architecture (including a common instruction set architecture, or ISA, for processing circuitry therein) may be employed on a range of platforms that include smartwatches, mobile computing devices (e.g., tablet, smartphones), set top boxes for televisions, laptop and desktop computers, server systems, and so on. These different platforms may have varying functional requirements despite the common SoC architecture. For example, while a smartphone may include a camera that utilizes an image processing system, a set top box utilizing an SoC of the same architecture may have no need to perform any image processing.

At the end of a manufacturing process, SoCs/ICs undergo testing to verify their functionality. In some cases, certain circuit blocks may fail testing. However, failure of some circuit blocks does not necessarily render unusable a particular instance of the SoC/IC. For example, if an image processing system for a camera fails in a particular instance of an SoC, it may nevertheless still be usable in a platform that does not utilize a camera, such as a desktop computer or a television set top box. In another example, in an SoC having a number of processor cores, an instance thereof having some failing instances thereof may nevertheless still be useful in a system that does not require the full complement of processor cores. Thus, an SoC that may not be usable in a high-power desktop computer due to some failing processor cores may nevertheless be useful in a smartwatch, a tablet computer, or other platform with lower processing requirements.

Instances of an SoC (and more generally, any IC) that remain usable despite some failing circuit blocks may use programmable registers to disable the failing circuit blocks. This may prevent these circuit blocks from receiving any power, and may also prevent them from receiving a clock signal. By disabling them from receiving power and/or clock signals, these functional circuit blocks may thus be inhibited from inadvertently generating any signals that could adversely affect operation of other circuit blocks that are fully functional. Furthermore, disabling an unused functional circuit block by inhibiting power from being provided thereto may reduce static power consumption by the IC/SoC.

When a particular instance of an SoC is designated as usable in a particular platform, it may have functional circuit blocks thereon that are unused but nevertheless have passed testing. Referring again to an example given above, a desktop computer may include an SoC having an image processing circuit that is fully capable of carrying out its intended function, despite having no need for such circuitry. To use another example given above, an SoC designated for implementation in a set top box may also have a functional image processing circuit without a corresponding need for the same.

The present disclosure thus contemplates an SoC of a particular design that is capable of being used in a large variety of different platforms. The disclosure further contemplates various methods for harvesting SoCs to be used in particular ones of those platforms. The SoC of the particular design may include programmable registers for each functional circuit block that is coupled to receive power via a power switch and is thus capable of being powered off during operation (e.g., for entry into a sleep mode). These programmable registers, when programmed, may render the corresponding functional circuit block incapable of receiving power, effectively disabling it.

The present disclosure contemplates programmable registers as being one-time programmable devices with limited programmability. For example, a default condition for a programmable register, when not programmed, may be to allow enablement of a corresponding functional circuit block. However, when programmed, the programmable register may cause the corresponding functional circuit block to be disabled. The limited programmability in various embodiments may prevent the programmable register from being re-programmed to subsequently enable a previously disabled functional circuit block. Furthermore, the programmable registers of the present disclosure may be one-time programmable devices in that, once programmed to disable a given functional circuit block, these registers remain programmed in that state for at least the remainder of a particular session of a computing platform (where the beginning of the session may be marked by a cold boot).

In one embodiment, a method includes testing an SoC and determining which of its various functional circuit blocks are capable of carrying out their intended functions. Based on this testing, the functional circuit blocks that fail test (if any) may be disabled by programming their corresponding programmable registers in order to render them incapable of receiving power. Based on which functional circuit blocks are disabled through as a result of this testing, an SoC may be designated for use in one or more platforms that do not utilize the capability of the disabled circuits. Thus, for example, an instance of an SoC having image processing circuitry disabled through programming of corresponding programmable registers may be designated for use in a server, a desktop computer, or set top box (assuming other required capabilities are enabled), while being ruled out of use in, e.g., a smartphone or a tablet that utilizes this functionality in conjunction with a camera. In another example, an SoC having multiple (but not all) processor cores disabled may be designated for used in a smartwatch, but ruled out of use in a high-power desktop computer.

The present disclosure further contemplates disabling additional functional circuit blocks of an SoC (or more generally, an IC) through the use of ones of the programmable registers. The computer system may receive a harvesting command (e.g., from a cryptographic signature or other source) and may program additional programmable registers to cause the disabling of the additional functional circuit blocks.

In light of the above, the present disclosure further contemplates a methodology for harvesting ICs/SoCs based on test results and platform requirements. In an embodiment, an SoC may undergo testing to determine the ability of its various functional circuit blocks to carry out their intended operations. After testing, if certain functional circuit blocks fail while others are fully functional, the SoC may be designated for use in one or more platforms that do not require the functional circuit blocks that failed test. The SoC may then be selected for a particular platform, and configuration registers may be programmed during a system boot (e.g., a cold boot) to cause any additional unneeded functional circuit blocks to remain powered down during operation of the SoC.

With regard to an IC/SoC per the present disclosure, at least one programmable register may be provided for each functional circuit block having a dedicated power switch that allows it, when enabled, to be powered down independently of other functional circuit blocks. In some embodiments, a particular functional circuit block may include programmable registers that causes, when both are programmed, power gating and clock gating of a particular functional circuit block.

The present disclosure contemplates a wide variety of functional circuit blocks that may be powered down independently of others. Examples of such functional circuit blocks include (but are not limited to) processor cores, memory controllers, graphics processing cores, image system processors, various input/output (I/O) circuits such as various radio frequency communications circuits (e.g., cellular, WiFi, Bluetooth circuits), serial and parallel communications links for conveying data to/from the SoC/IC, network interface circuits (e.g., an Ethernet controller), and so on.

The present disclosure further contemplates that some SoCs/ICs include an "always on" section that communicates with other functional circuit blocks. As defined herein, an always on circuit is a functional circuit block that continues to receive power and operate any time the SoC/IC is receiving power (and thus, is never placed in a sleep state). An example of a circuit in an always on functional circuit block is a processor that, in an SoC of a smartphone, responds to a touch of a touch screen when other portions of the SoC are in a sleep state. This processor may wake up other portions of the SoC to allow the resumption of operations. Since functional circuit blocks in an always on section of an SoC/IC may be configured to communicate with other functional circuit blocks in the SoC, it is possible that signals may be sent to circuitry that is disabled through the use of particular ones of the programmable registers. Accordingly, the present disclosure contemplates additional programmable registers that may be used to sever communications between always on circuitry and functional circuit blocks that have been disabled due to having failed test or otherwise being unneeded for the particular platform.

In some instances, a particular functional circuit block that is intended to be disabled may be needed for certain functions during a boot of the system (e.g., a cold boot). For example, an IC/SoC may include built-in self-test (BIST) functionality, with BIST controllers being implemented in various ones of the functional circuit blocks, including ones that are to be disabled for the particular computing platform. These BIST controllers may be coupled to one another in a daisy-chain configuration, and may carry out testing and communications with a main BIST controller during a system boot. If a particular functional circuit block was disabled, the communications link to the main BIST controller via the daisy chain would be severed. Accordingly, the disclosure contemplates programming of selected ones of the programmable registers to enable limited functionality during a system boot procedure to allow tasks (such as aforementioned testing using BIST controllers) to be carried out, with corresponding functional circuit blocks disabled thereafter. The disabling of these functional circuit blocks may be carried out after the completion of their designated tasks and before system software has access thereto. The disabled functional circuit blocks may remain disabled for the entirety of the session, until a next cold boot, after which the same cycle may repeat.

Various embodiments of a multi-platform IC/SoC and methods for configuring the same for a particular platform are now discussed in further detail. The description begins with discussions of various embodiments of an IC/SoC that can be configured for use in various ones of a variety of different platforms while implementing a common architecture among all. A product matrix and a system diagram illustrating different platforms an SoC with a given architecture may be used is then discussed. Thereafter, a description of various methods by which an IC/SoC of the present disclosure may be tested, configured, implemented, and operated follows. The description concludes with discussions of a test system used to test an IC/SoC and a computer readable medium upon which the design of an IC/SoC is represented and usable for manufacture of the same follow.

Multi-Platform IC/SoC Embodiments:

FIG. 1 is a block diagram of one embodiment of an IC that can be configured for use in one of a variety of different platforms. IC 100 is shown here by way of example to illustrate a configurable IC, and it not intended to limit the disclosure to any specific IC embodiment.

In the embodiment shown, IC 100 includes a programmable register file 103 and a plurality of power switches 104. The power switches are coupled to provide various supply voltages (e.g., Vdd1, Vdd2, etc.) to correspondingly coupled functional circuit blocks. In the embodiment shown, Vdd1 may be provide to graphics processing unit (GPU) circuit block 110 (which includes a number of GPU cores via switches S1 and S2, Vdd2 may be provided central processing unit (CPU) circuit block 105 (comprising a number of processor cores) via switches S3, S4 and S5, Vdd3 may be provided to functional circuit block 115 via switch S6, and Vdd4 may be provided to functional circuit block 116 via switch S7. Functional circuit blocks 115 and 116 may be one of a number of different types of circuits, such as an image processing circuit, a network interface, a radio frequency (RF) circuit (e.g., a WiFi transceiver), and so on. The various circuit blocks, including CPU circuit block 105 and GPU circuit block 110, may represent heterogenous processing blocks that carry out various functions of IC 100.

In this particular example, GPU circuit block 110 is at least partially disabled by virtue of S2 being open, which may be the result of programming a corresponding programmable register in programmable register file 103. Accordingly, the supply voltage Vdd1 is provided to only some portions of GPU circuit block 110, but not all. Similarly, CPU circuit block 105 is partially disabled by virtue of the open state of S5, while switches S3 and S4 are closed to provide power to portions thereof. Functional circuit block 115 in this example is fully disabled by virtue of switch S6 being open, while functional circuit block 116 is fully enabled due to the state of S7 being closed. The open state of these switches in this example is the result of programming corresponding ones of the programmable registers in programmable register file 103.

The disabling of particular ones of the circuit blocks, or portions thereof, may be accomplished in the embodiment shown may be carried out by programming ones of the corresponding programmable registers (PR1-PR) in programmable register file 103. In one embodiment, a particular programable register may be programmed to cause its corresponding power switch to remain open to disable all or a portion of a functional circuit block. Generally speaking, programmable registers according to the disclosure may fully or partially disable a corresponding functional circuit block by inhibiting power and/or clock signal (or both) from being provided thereto.

It is noted that while the programmable registers shown in FIG. 1 are grouped into a single unit, programmable register file 103, this configuration is not intended to be limiting. On the contrary, the ones of the programmable registers may be distributed about IC 100 in any desired manner.

The programmable registers of the disclosure are in various embodiments of limited programmability. For example, a programmable register may, in its unprogrammed state, allow power to be provided to a corresponding functional circuit block. When programmed, this same programmable register may cause a corresponding power switch to open to disable the functional circuit block by preventing it from receiving power. Once programmed to disable its corresponding functional circuit block, a particular programmable register may be unable to be reprogrammed to subsequently enable that same functional circuit block to carry out its intended operation.

In various embodiments, one or more of the programmable registers may be switches of limited programmability (e.g., from enabled to disabled), and which may further be one-time programmable structures. For example, a switch circuit that, once opened, cannot be closed again during a particular session (or vice versa) may be used to implement a programmable register. Embodiments in which a programmable register is implemented as a programmable read-only memory (PROM) structure are also contemplated. In some embodiments, fuses may be used to implement at least some of the programmable registers, wherein a given one of the fuses, when blown, disables a corresponding one of the functional circuit blocks or portion thereof (e.g., inhibits power and/or a clock signal from being provided thereto). Generally speaking, a programmable register per the disclosure is a device or circuit that, once programmed to a particular state, cannot be re-programmed to a different state, and further, can only be programmed to a specific value. With regard to functional circuit blocks of a given embodiment, a programmable register per the disclosure is limited in that it can be programmed from its default state of allowing enablement to one of disabling a corresponding functional circuit block, but cannot be programmed in the reverse direction.

It is further noted that different types of programmable registers may be used in a single embodiment. For example, the disclosure contemplates embodiments in which fuses are used to implement some programmable registers and switch circuits that are one-way operable are used to implement other ones of the programmable registers.

IC 100 in the embodiment shown may be utilized in any one of a plurality of different platforms. Using the programmable registers of programmable register unit 103 and power switches 104, an instance of an IC may be configured for use in a particular platform by disabling or leaving enabled various ones of the functional circuit blocks and processing blocks. This may include disabling some peripheral components while leaving others enabled, and may also include disabling portions of, e.g., the CPU circuit block 105 and GPU circuit block 110. In some platforms, peripherals are enabled or disabled on a need basis. For example, for a desktop computer that does not utilize a camera, a corresponding instance of an IC/SoC may disable an image processing circuit block designed to support camera operation.

Furthermore, the amount of processing power enabled and disabled may vary from one platform to another. Thus, an instance of an IC/SoC slated for use in a high performance desktop computer (e.g., a gaming PC) may utilize the full complement of CPU and GPU cores. On the other hand, an instance of the IC/SoC used in an entry level smartphone may utilize a reduced complement of CPU and GPU cores, and thus portions of respective CPU and GPU circuit blocks may be disabled. Using this approach, a single design of an IC/SoC may be used for a variety of platforms including (but not limited to) smartwatches, servers, desktop computers, laptop computers, tablets, smartphones, TV set top boxes, and so on, as well as in different performance classes of a given type of platform (e.g., a high performance desktop computer or a medium performance desktop computer). The design of the IC/SoC may implement a common computing architecture in all of these systems, with the main difference being the capabilities that are enabled or disabled.

Figure 2:
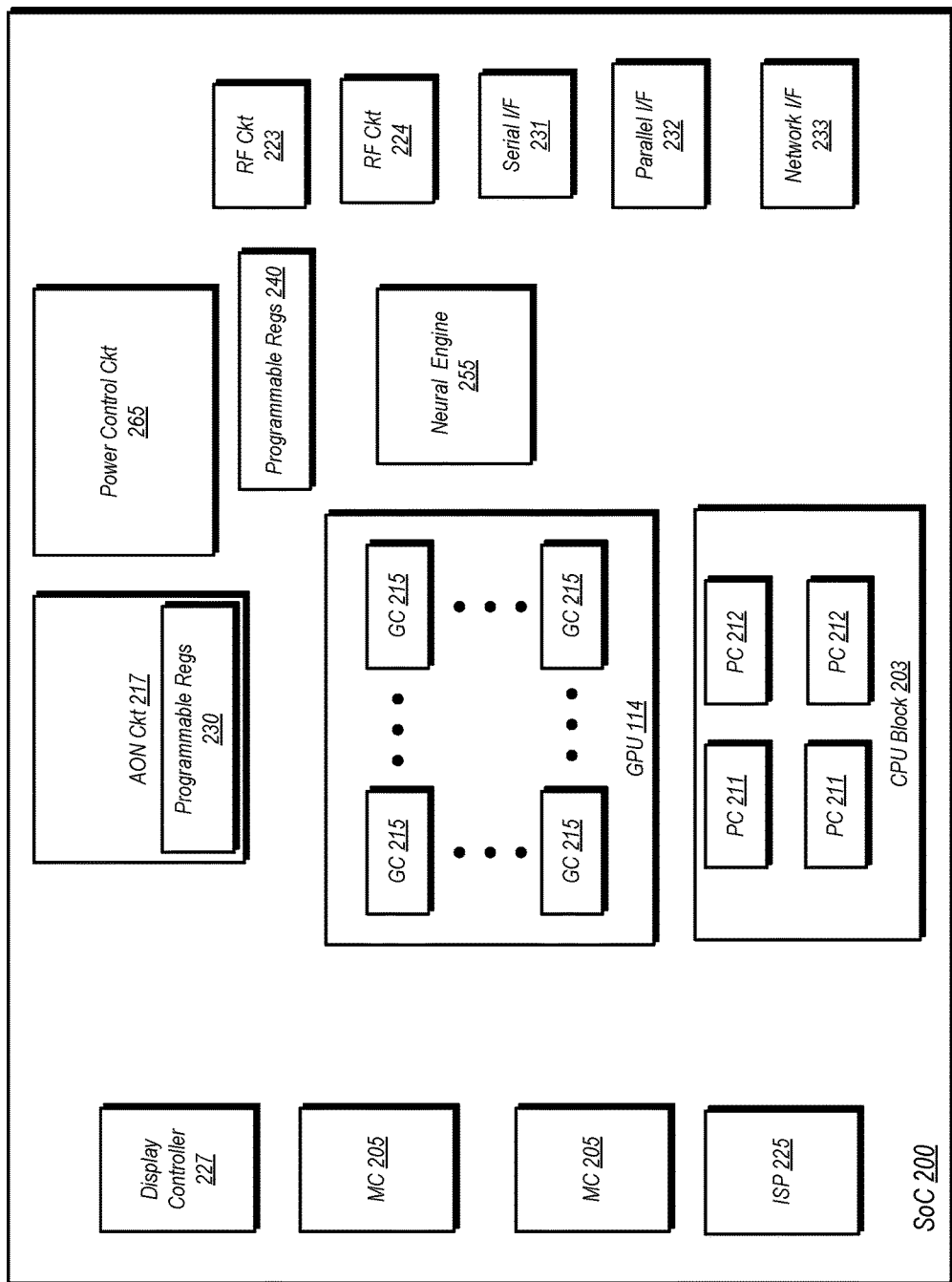
FIG. 2 is a block diagram of one embodiment of a system-on-a-chip (SoC).

FIG. 2 is a block diagram of one embodiment of an SoC that can be used in a wide variety of platforms. In the embodiment shown, SoC 200 includes a number of different functional circuit blocks, and may be implemented in a wide variety of different platforms that operate using a common computing architecture. These platforms include (but are not limited to) smartwatches, smartphones, tablet computers, laptop computers, desktop computers, monitors, television set top boxes, server computers, Internet of Things (IoT) devices, and various vehicle-based computing systems, among others. The various devices to which SoC 200 is applicable may utilize a common computing architecture that may allow for relatively seamless data transfer and communications among these different platforms. However, due to the large number of different functional circuit blocks present in SoC 200, some may be unused in certain platforms. The present disclosure describes various methods and mechanisms that may be used to configure an instance of SoC 200 for use in a particular platform while disabling functional circuit blocks that are not used or needed. This may provide various advantages, such as reducing static power consumption, as well as reducing spurious noise that might be generated by otherwise unused circuits.

SoC 200 in the embodiment shown includes a number of different functional circuit blocks. These functional circuit blocks may each be provided power via a corresponding power switch (not shown here), and may be powered up or down independently of other ones of the functional circuit blocks of SoC 100.

The functional circuit blocks of SoC 200 include a CPU block 203 having processor cores 211 and 212. In this embodiment, processor cores 211 and 212 are general-purpose processors that are optimized for different objectives. For example, processor cores 211 may be optimized for high performance, with the ability to handle heavy workloads, while processor cores 212 are optimized for processing lighter workloads while limiting power consumption. While FIG. 2 includes four processor cores, this is not intended to be limiting with regard to the number of cores in a particular embodiment. For example, embodiments having 16 processor cores are possible and contemplated within the scope of this disclosure. Furthermore, while the embodiment shown contemplates heterogenous multi-core processing, embodiments utilizing homogenous multi-core processing are also possible and contemplated. The number of processor cores that are enabled in a particular platform may vary according to the processing needs of that platform. Accordingly, some of the processor cores of SoC 200 may be disabled in some platforms. For example, in a high-end desktop computer system, all processor cores may be enabled, while in an entry-level laptop computer, one of processor cores 211 and one of processor cores 212 may be disabled.

Various embodiments of SoC 200 include a neural engine 255, which may be used to carry out various machine learning functions. In some embodiments, neural engine 255 may be a processor circuit that acts as a coprocessor for the various processor cores 211. In such embodiments, neural engine 255 may receive instructions from the various ones of the processor cores 211, carry out operations in accordance therewith, and return results thereto. Neural engine 255 in various embodiments may include an array of processing elements, and these may be independently disabled relative to other ones of the processing elements.

SoC 200 in the embodiment shown also includes a graphics processing unit 214, which includes, as functional circuit blocks, a number of different graphics cores 215. The graphics cores 215 may comprise circuitry to carry out various graphics processing functions, but may also, in some embodiments, carry out processing functions having some degree of parallelism. The number of graphics cores 215 enabled in SoC 200 may vary from one platform to the next. For example, a desktop computer optimized for gaming or other graphics intensive processing may enable all graphics cores, while, an application such as a smartwatch may use fewer graphics cores and thus have fewer enabled. In platforms that require no graphics processing, all graphics cores 215 may be disabled.

SoC 200 in this particular embodiment includes two memory controllers 205, although the number of memory controllers in other embodiments may be greater or lesser than that shown here. Each of the memory controllers 215 comprises circuitry that is used to facilitate communications between a system memory and other functional circuit blocks, such as the processor cores 211 and 212. Some platforms may utilize more memory controllers 205 than others. For example, a desktop computer may utilize multiple memory controllers 205, while a smartwatch may utilize only a single instance of the same. Accordingly, in the latter example, all but one of the memory controllers 205 may be disabled.

In some embodiments, the various memory controllers 205 may be associated with corresponding on-chip memories that share a common voltage supply. Since these memories share a common voltage supply, they cannot be powered down independently of one another. Accordingly, it is desirable in such situations to drive various signals, such as a reset signal, or conversely, inhibit a chip select signal, to prevent the unused memory from creating noise or leakage. The present disclosure therefor contemplates providing supporting logic that will perform the functions of controlling a reset signal or a chip select signal when the corresponding memory controller 205 is disabled. For example, the supporting logic may prevent de-assertion of a reset signal to the unused memory, thereby keeping the unused memory in a reset state and preventing it from generating noise that could affect the operation of other circuits. This supporting logic may be activated through, e.g., the use of the programmable registers discussed elsewhere herein.

SoC 200 also includes a display controller 227. The display controller 227 may include circuitry that carries out various functions with regard to controlling a display, such as a touch screen (e.g., for a smartphone or tablet computer) or a monitor coupled to a desktop computer. Some platforms, such as a television set top box or a server, may not include a dedicated display or, in the latter case, be coupled thereto. In such platforms, the display controller 227 may be disabled.

Image system processor (ISP) 225 in the embodiment shown includes circuitry that performs image processing in conjunction with a camera that is included in such platforms, such as a tablet computer or smartphone. This image processing circuitry may include pixel circuits, sampling circuits, analog-to-digital converters, and so on. ISP 225 may be disabled in some platforms that do not utilize cameras, such as a desktop computer, a server computer, or a television set top box.

SoC 200 in the embodiment shown includes a number of different input/output (I/O) circuits that enable communications with the outside world. These circuits include radio frequency (RF) circuits 223 and 224, serial interface 231, parallel interface 232, and network interface 233.

RF circuits 223 and 224 may include transceiver circuits and processing circuits for various RF communications protocols, such as Bluetooth, WiFi, cellular communications (e.g., 4G, 5G), and near-field communications (NFC). The number of RF circuits in a given embodiment of SoC 200 may thus be different than that shown here. Nevertheless, some RF circuits implemented on SoC 200 may not be used in all of the possible platforms in which it may be included. For example, as a desktop computer is not used to make touchless payments, an NFC communications circuit may be disabled in an embodiment of SoC 200 implemented in that particular platform.

The number of serial interfaces 231 included in SoC 200 may also vary from one embodiment to the next. For example, a number of serial interfaces 231 having circuitry for Universal Serial Bus communications transferred over a wired link may be included on SoC 200. Serial interfaces 231 for other communications protocols, such as Inter-IC communications ($I^2C$) and serial peripheral interface (SPI), among others, may also be included on SoC 200. Some platforms may not utilize the full complement of serial interfaces 231, and may further not utilize certain serial interfaces dedicated to certain communications protocols. For example, a laptop computer may utilize a lower number of USB ports than a desktop computer, and may thus have fewer serial interfaces 231 dedicated to this particular protocol. Accordingly, serial interfaces 231 that are unused in a particular platform may be disabled.

One or more instances of a parallel interface 232 may be used to facilitate parallel communications with other devices external to SoC 100 according to various parallel communications protocols. Such protocols may include the high performance parallel interface protocol (HIPPI), the parallel peripheral interface (PPI) protocol, and others. Platforms such as a smartwatch or a television set top box may not utilize parallel communications with external platforms, and may thus disable at least some instances of parallel interface 232.

Network interface 233 in the embodiment shown may include circuitry for interfacing SoC 200 to a wired network according to a particular network protocol, such as the Ethernet protocol. Other instances of network interface 233 that facilitate communications with networks using other protocols are also possible and contemplated. Since some platforms, such as a smartwatch, do not utilize wired network communications, any instances of a network interface 233 implemented in an SoC may be disabled when used in such a platform.

Although not explicitly shown here, SoC 200 may also include a number of different power supply circuits. Such circuits may include various types of voltage regulators, such a switching regulators (buck and boost converters), low dropout voltage regulators, and other types of circuits used for the generation of supply voltages. In some instances, the functional circuit block(s) coupled to receive power from a particular power supply circuit may be disabled such that the power supply circuit has no loads to which to provide a supply voltage. Accordingly, such power supply circuits may be disabled, using programmable registers per the disclosure.

SoC 200 in the embodiment shown also includes a power control circuit 265, which is used to carry out various functions. These functions includes the disabling of various functional circuit blocks in accordance with the programming of the programmable registers per this disclosure. In one embodiment, on a system boot, power control circuit 265 may read the programmable registers from programmable register files 230 (in AON circuit 217) and 240 carry out the disabling of specified functional circuit blocks of SoC 200 in accordance with the programming thereof. In disabling functional circuit blocks, power control circuit 265 may ensure that a power is not provided thereto, e.g., by causing a power switch to remain open. Power control circuit 265 may also cause the inhibiting of a clock signal from being provided to disabled functional circuit blocks. In the case of the memories discussed above, power control circuit 265 may ensure that a reset signal is asserted to any unused memories in the system by corresponding memory controllers (which may otherwise be disabled). Furthermore, any unused power supplies on SoC 200 that are unused due to their various loads being disabled may also be turned off by power control circuit 265.

In some embodiments, circuitry that is to be disabled in accordance with the specified configuration of SoC 200 may include functionality that may be needed during initialization of the system during a cold boot (defined herein as a system boot that occurs upon applying power to the system after having been in a powered down state). Such functionality may include BIST functionality, initial memory calibrations, memory repair, and so on. Accordingly, power control circuit 265 may allow such to-be-disabled circuits to carry out various tasks during the cold boot procedure prior to their eventual disablement. The tasks performed by such functional circuit blocks (or portions thereof) may be performed prior to the beginning of the loading of operating system software. Upon completion of these tasks, and prior to commencing the operating system load, power control circuit 265 may then disable these functional circuit blocks or corresponding portions thereof in accordance with the configuration of SoC specified by the programming of the various programmable registers.

SoC 200 in the embodiment shown also includes an always on (AON) circuit 217. As defined herein, an always-on circuit is one in which one or more functional circuit blocks thereof continue operating any time SoC 200 is receiving power. The types of circuitry implemented in AON circuit 217 may include one or more auxiliary processors that carry out various functions, such as responding to touches of a touch screen, a movement of a mouse, and so on. For example, in one embodiment, a processor that wakes other portions of SoC 200 from a sleep state in response to a touch of a touch screen may be included in AON circuit 217. AON circuit 217 may also include, in various embodiments, power management circuitry that can carry out various operations such as setting a performance state of a particular functional circuit block or subsystem (where a performance state is defined as a unique combination of an operating supply voltage and a clock frequency). In one embodiment, power control circuit 265 may be implemented in the same power domain as AON circuit 217.

One or more signal connections may exist between circuitry in AON circuit 217 and other ones of the functional circuit blocks of SoC 200. However, since some of these functional circuit blocks may be disabled in a given platform, the present disclosure contemplates disabling the connections between them and AON circuit 217. This isolates a disabled functional circuit block from signals output from AON circuit 217. For example, if AON circuit 217 includes one or more signal connections with a memory controller 205 that is disabled in a particular instance of SoC 200, those connections may also be disabled through the use of the programmable registers of the disclosure. This may prevent the transmission of signals to these disabled functional circuit blocks, thereby saving power and prevented unwanted system noise.

The disabling of various functional circuit blocks in SoC 200, as well as connections to AON circuit 217, may be carried out through programmable registers per the disclosure. Additional circuitry, such as that which may cause the tri-stating of unused signal lines may also be implemented. AON circuit 217 in the embodiment shown includes a programmable register file 230 that may be used to disable various ones of functional circuit blocks of SoC 200. Embodiments in which all of the programmable registers are consolidated within programmable register file 230 (instead of having a separate programmable register file 240) are possible and contemplated.

The various registers of programmable register files 230 and 240 may be, in one embodiment, programmed during a system boot routine, prior to beginning the loading of an operating system. This may be carried out by, e.g., a bootloader, which may read a signature file (such as a cryptographic signature) that specifies the configuration of SoC 200 in accordance with its designated computing platform. In indicating which functional circuit blocks will be disabled during operation, the signature may also indicate signal lines coupled between disabled functional circuit blocks and AON circuit 217 are to be disabled by, e.g., by tri-stating circuitry that is configured to drive the signals on these lines. By disabling signal lines coupled between AON circuit 217 and disabled functional circuit blocks elsewhere on SoC 200 may prevent unwanted signal transmission that do not otherwise contribute to the performance of the system.

The use of programmable registers to disable functional circuit blocks of SoC 200 may allow for a more precise configuration of an instance thereof for use a particular platform. Some functional circuit blocks of SoC 200 may be disabled in response to having failed during a manufacturing test. The failing functional circuit blocks may render the instance of SoC 200 unusable for some platforms or some performance classes of a particular type of platform, while being usable for other platforms. For example, the failure of a single one of processing cores 211 or 212 may render an instance of SoC 200 unusable for a high-performance computing system, while it may nevertheless retain its usability for a mid-level system. Thus, in response to the manufacturing test failures, any failing functional circuit blocks may be designated to be fully disabled in a signature file. In embodiments in which at least some of the programmable registers are implemented using fuses, such fuses may be blown to disable failing functional circuit blocks upon completion of the test.

Additional, non-failing functional circuit blocks may also be disabled for a given instance of SoC 200 after it has been designated for a particular platform. After a test in which some functional circuit blocks of an instance SoC 200 fail, the number of possible platforms in which it may be used may be narrowed down. However, once the instance of SoC 200 is designated for use in a particular platform, there may be additional functional circuit blocks that, while fully capable of carrying out their intended operations, are nevertheless unneeded, and may thus be disabled through the use of the programmable registers described elsewhere herein. Consider, for example, an instance of SoC 200 that includes a functional circuit block to support cellular communications, with that block failing during the manufacturing test. This instance of SoC 200 may be eliminated for use in a smart phone, but may nevertheless retain a full complement of processor cores and GPU cores, making it usable in a high-power desktop computing system. The instance of SoC may also have a fully functional image processing system, which is usable in a smart phone but not usable in a desktop computer. Accordingly, the instance of SoC 200 may be designated for use in the high-performance desktop computer, and the image processing system may be disabled through the programming of corresponding programmable registers.

It is noted that while the components of SoC 200 in the embodiment shown here are indicated as being on the same IC, this embodiment is not intended to be limiting. In some embodiments, the various functional circuit blocks of SoC 200 may be implemented on separate IC dies that may be combined within or on a single package (e.g., a substrate or the like) that is mountable on a printed circuit board. Accordingly, an alternate view of SoC 200 as illustrated in FIG. 2 may be one in which various ones of the functional circuit blocks are implemented on different IC dies that are then combined into a single package.

Figure 3:
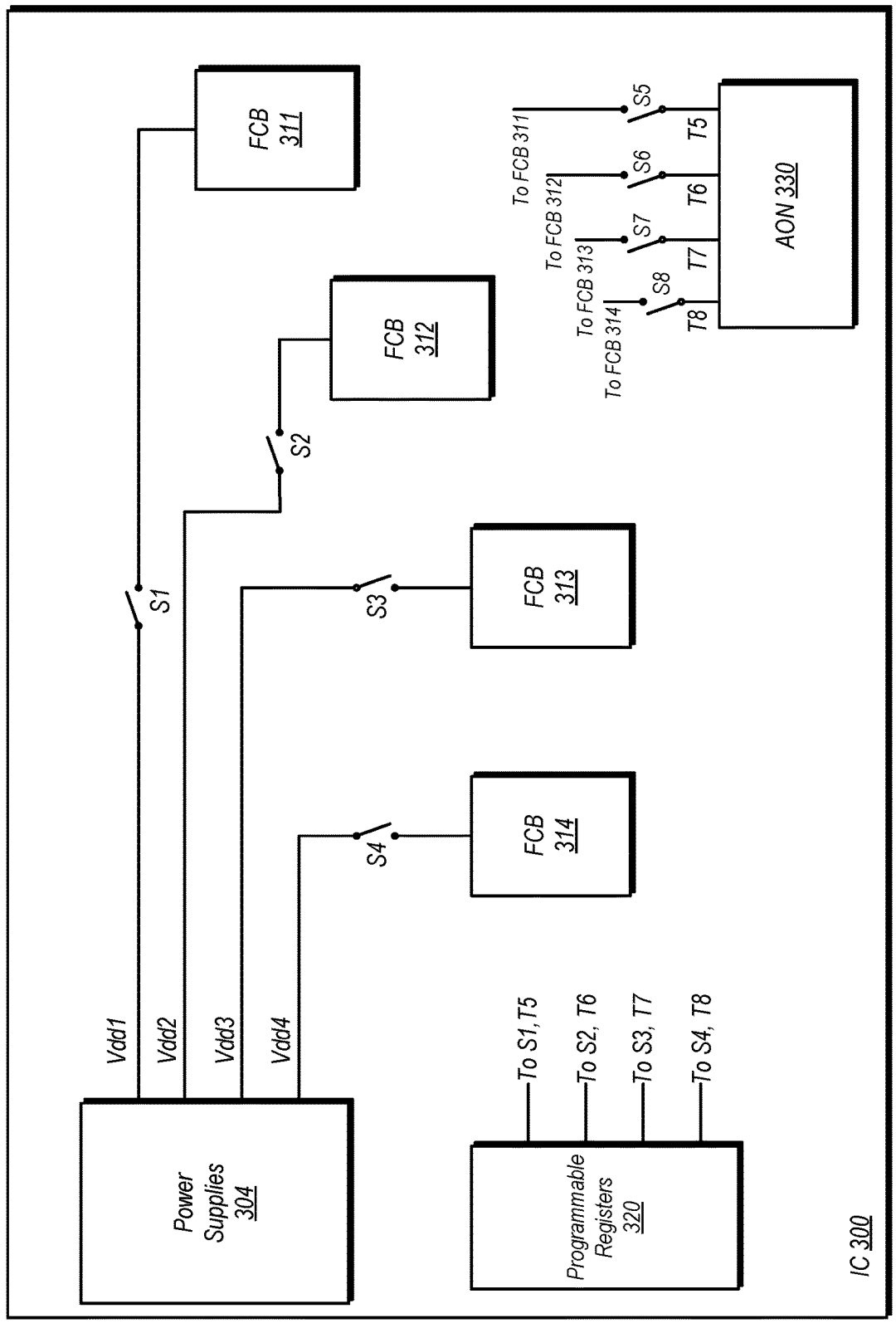
FIG. 3 is a block diagram of another embodiment of an IC.

FIG. 3 is a block diagram of one embodiment of an IC having a number of different functional circuit blocks that operate according to supply voltages provided from different power supplies. In the embodiment shown, IC 300 includes a number of functional circuit blocks 311-314, which are coupled to receive supply voltages Vdd1-Vdd4, respectively. These supply voltages may be generated by different power supplies, which are collectively shown here as power supplies 304. The various power supply circuits implemented in power supplies 304 may include various types voltage regulators such as buck regulators, boost regulators, LDO regulators, and so on. Each of these regulators may be coupled to their respective loads via power switches S1-S4 (e.g., Vdd1 is provided to FCB 311 via power switch S1, etc.).

In the embodiment shown, each of the power switches S1-S4 is associated with a corresponding one of the programmable registers in programmable register file 320. More generally, each power switch on a given instance of an IC or system in accordance with this disclosure (including SoC 200 discussed above) may be associated with at least one programmable register such that corresponding functional circuitry can be disabled in accordance with its programming. The actual mechanism for ensuring that power is not provided to the corresponding functional circuit block due to the programming may vary from one embodiment to another. For example, in response to the programming of a corresponding register, a power control circuit may cause a corresponding power switch to the designated functional circuit block to remain open, thereby inhibiting it from receiving power. In some cases in which a given functional circuit block is the only load for a corresponding power supply, the power control circuit may turn off that power supply.

In the embodiment shown IC 300 also includes an AON circuit 330, which may continue to receive power any time IC 300 itself is receiving power. AON circuit 330 may include a number of signal paths coupled to other functional circuit blocks. In this example embodiment, these signal paths are T5-T8, with each signal path including a respective one of switches S5 to S8. These are examples of signal paths that may be used to convey signals between various ones of the functional circuit blocks and AON circuit 330 during operation. However, since some functional circuit blocks of IC 300 may be disabled, the disclosure also contemplates, through the use of programmable registers in programmable register file 320, disabling correspondingly coupled signal paths. In this example, disabling a signal path may be carried out by opening a corresponding switch, although other mechanisms are possible and contemplated (e.g., tri-stating a driver circuit intended to transmit a signal on the corresponding signal line). Disabling a signal pathy may prevent the conveying of signals between AON circuit 330 and a disabled functional circuit block.

The mechanism for programming configuration registers 320 may vary from one embodiment to another. In one embodiment, configuration registers 320 may be programmed during a cold boot process, prior to beginning the load of an operating system. This programming may be carried out based on a signature stored elsewhere in the system, the signature indicating the specified configuration for than instance of IC 320. The programming in one embodiment may be performed by a bootloader during the cold boot.

Similarly, the mechanisms by which configuration registers 320 disable a functional circuit block or a signal path therefrom coupled to AON circuit 330 may vary from one embodiment to another. In one embodiment, when a particular register is programmed, it may cause assertion of a signal that forces a corresponding power switch to remain open during operation, thereby preventing the corresponding functional circuit block from receiving power. Similarly, the particular register, when programmed, may cause a signal to be conveyed to circuitry within AON circuit 330 to prevent it from attempting to transmit or receive signals from a correspondingly disabled functional circuit block. Other disabling mechanisms based on the programming of configuration registers 320 are also possible and contemplated, including the use of fuses.

Generally speaking, the present disclosure contemplates an IC/SoC/package that may be used in a large number of platforms having different functional requirements. The IC/SoC/package may have a number of different functional circuit blocks therein to support the functional requirements of each of the various platforms in which it may be used. Furthermore, additional functional circuit blocks of a given type may be implemented in some embodiments in order to improve the manufacturing yield, e.g., by providing extra capability in the event of failure of a particular functional circuit block. Thus, if a particular instance of a functional circuit block fails test, but another instance that provides the same functionality passes test, the corresponding IC need not be scrapped. Furthermore, since an IC may be used in a wide variety of different platforms having different functional requirements, functional circuit blocks that are not needed in a particular platform may be disabled. This may occur as a response to a manufacturing test in which a given functional circuit block fails test and is disabled, thereby narrowing the list of platforms in which it may be suitably used. Additional disabling of functional circuit blocks may occur thereafter if they are not needed in the designated platform. Accordingly, an IC/SoC/system and the various methods disclosed herein may allow for improved yields as well as a large degree of product differentiation with a single IC/SoC/package design, e.g., one having a particular computing architecture that may be used in a wide variety of platforms.

It is noted that the present disclosure contemplates scenarios in which an instance of an IC passes a test with no faulty functional circuit blocks (e.g., all perform as intended). In such scenarios, any functional circuit blocks that are unneeded for the selected platform can be disabled post-test by programming the programmable registers as discussed above.

With regard to the programming of the configuration registers 320, the present disclosure contemplates the utilization of a signature file, such as a cryptographic signature, that is read by boot code during a cold boot routine. The cryptographic signature may indicate the intended system configuration, and thus which of the functional circuit blocks, as well as any signal path connections to AON circuit 330, are to be disabled. It is noted that the configuration registers, once programmed, may be unable to be modified or cleared without another cold boot.

Figure 4A:
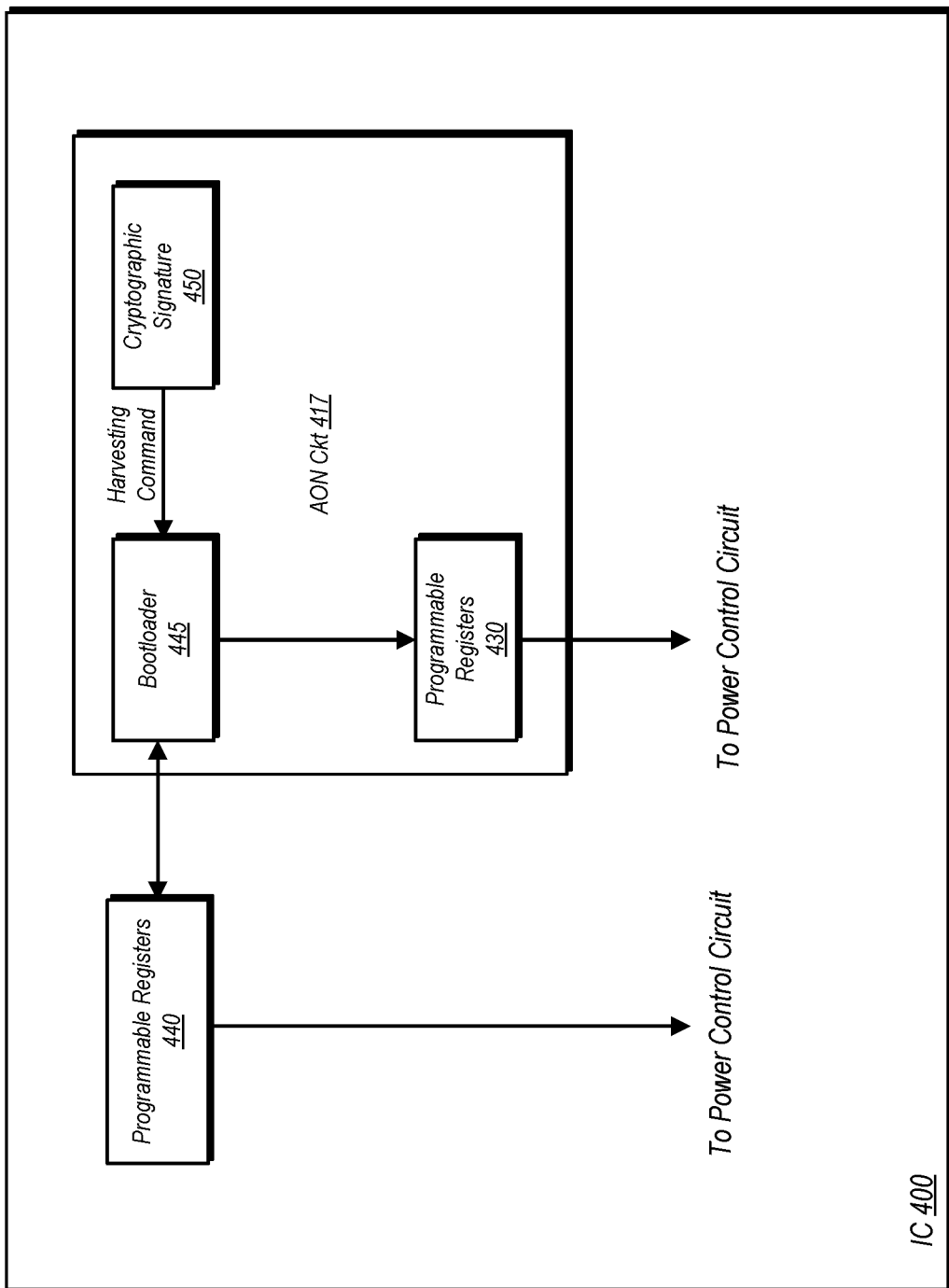
FIG. 4A is a block diagram of another embodiment of an IC.

FIG. 4A is a block diagram of another embodiment of an IC to illustrate certain aspects of the disclosure. In the embodiment shown, IC 400 includes an AON circuit 417 having a set of programmable registers 430, a bootloader 445, and a cryptographic signature 450. Bootloader 445 and cryptographic signature 450 may be implemented on a read-only memory or other non-volatile storage. An additional set of programmable registers 440 is shown here as being external to AON circuit 417, although it is noted that embodiments are possible and contemplated in which all of the programmable registers are consolidated into a single register file.

Bootloader 445 in the embodiment shown may include boot code used to begin the boot process during a cold boot. During the boot process, bootloader 445 may receive a harvesting command from cryptographic signature 450 to obtain information regarding the specified configuration of IC 400 and the platform in which it is to be implemented. The information accessed from cryptographic signature includes indications of any functional circuit blocks that are to be disabled for use in the designated platform. In some embodiments, bootloader 445 may access an additional programmable register file 440 in determining which functional circuit blocks are to be disabled for the specified configuration.

Using the information regarding which functional circuit blocks are to be disabled, bootloader 445 may program the programmable registers of register files 430 and 440. This programming operation may be carried out by bootloader 445 prior to beginning the loading of operating system software. The information programmed into the various programmable registers is then access by a power control circuit (not shown here), which may carry out the various operations to disable the designated functional circuit blocks. This may include inhibiting power and clock signals from being provided to disabled functional circuit blocks, as well as severing communications link thereto. Thereafter, when the operating system is loaded, the disabled functional circuit blocks are not visible thereto. Accordingly, the operating system software may configure itself, upon loading, to operate only with those functional circuit blocks that are enabled. In configuring itself for the particular platform, the operating system may forgo loading some portions that will not be used in the particular computing platform. For example, when the system is a desktop computing system, the operating system software may forgo loading drivers for an image system processor that is disabled by the programming.

Figure 4B:
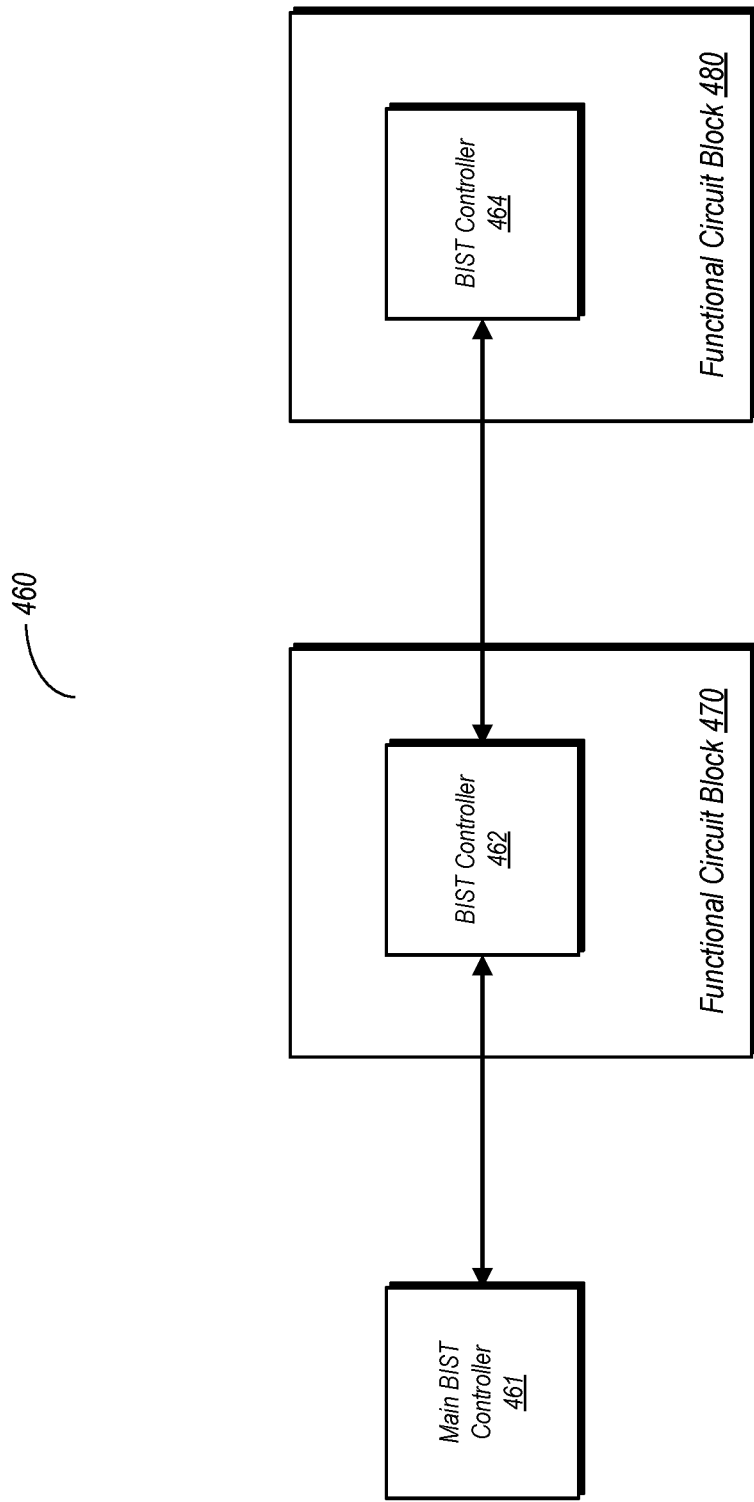
FIG. 4B is a block diagram of another embodiment of an IC in which functional circuit blocks are enabled to perform a task during a cold boot prior to disabling.

FIG. 4B is a block diagram illustrating the limited use of some functional circuit blocks during a cold boot prior to their disablement. In the embodiment shown, system 460 includes functional circuit blocks 437 and 480. System 460 also includes a main BIST controller 461, BIST controller 462 (in functional circuit block 470) and BIST controller 464 (in functional circuit block 480).

In the daisy chained configuration shown here, BIST controller 464 may communicate with main BIST controller 461 via BIST controller 480. Accordingly, BIST controller 464 relies on BIST controller 462 (and thus functional circuit block 470) to be receiving power in order to communicate with main BIST controller 461. However, functional circuit block 470 may be designated for disabling in system 400. When this is the case, a power control circuit that is configured to carry out the disabling of functional circuit blocks in accordance with the information stored in the programmable registers may delay the disabling of functional circuit block 470 until the testing by BIST controller 464 is complete and the results are conveyed to main BIST controller 461. This may also enable main BIST controller 461 to convey commands to BIST controller 464. The testing performed by the various BIST controllers in system 460 may be conducted during the cold boot process prior to the beginning of loading of operating system software. Accordingly, upon completion of the testing by the various BIST controller, the power control circuit may disable functional circuit block 470 per the specified configuration of system 460.

Generally speaking, the disablement of at least some functional circuit blocks that are to be disabled per the specified system configuration may be delayed during a cold boot process. This may allow various tasks that are necessary for system initialization to be formed, such as the example discussed above. Once these tasks have completed, a power control circuit or other logic in the system may then allow designated functional circuit blocks to be disabled prior to loading and initializing the operating system.

Figure 4C:
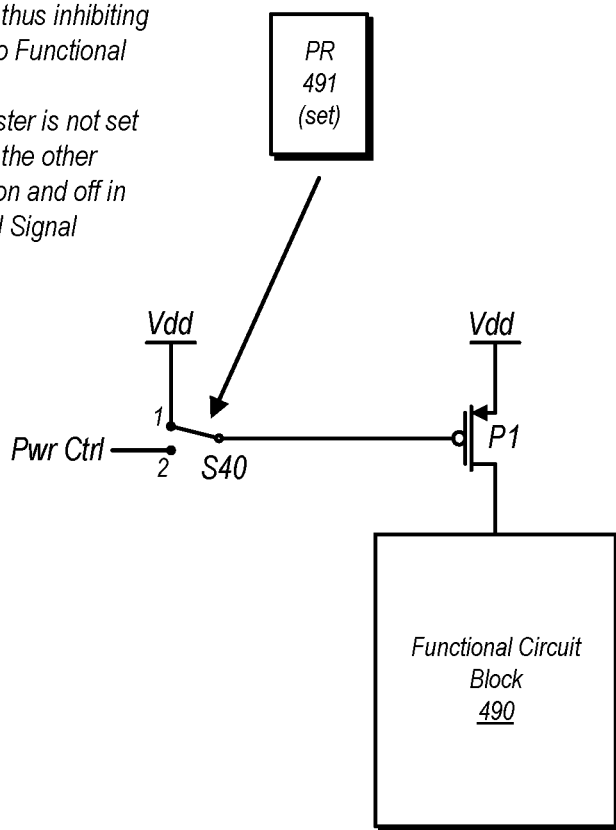
FIG. 4C is a diagram illustrating an example mechanism by which a functional circuit block may be disabled based on setting a programmable register.

FIG. 4C is a diagram illustrating an example mechanism by which a functional circuit block may be disabled based on setting a programmable register. In the illustrated example, a power switch P1 is coupled between a supply voltage Vdd and a functional circuit block 490. Power switch P1 is implemented here as a PMOS transistor, and is activated when its gate voltage is at least a threshold voltage less than the voltage on its source, which is coupled to Vdd.

A second switch, S40, is coupled to the gate terminal of P1. Switch S40 in the embodiment shown is a single-pole, double-throw switch. In a first position (shown here), S40 may couple the gate terminal of P40 to Vdd. In second position, S40 couples the gate terminal of P1 to the Pwr Ctrl signal, which may be used to activate and deactivate switch P1 as desired. For example, when S40 is in the second position, a power control circuit may activate P1 to allow functional circuit block 480 to be used to carry out its intended function, and deactivate P1 to cause functional circuit block 480 to enter a sleep mode.

In this example, programmable register 491 is set, or programmed, thereby indicating that the configuration of the system is such that functional circuit block 490 is to remain disabled. Accordingly, the power control circuit in this example may, as a result of the programming, cause S40 to remain in the first position during normal operations. Since this results in the gate terminal of P1 being coupled to Vdd, P1 is prevented from being activated, and thus no supply voltage is received by functional circuit block 490.

The example of FIG. 4C is but one of a number of possible mechanisms that can be used to disable a functional circuit block based on the information stored in programmable registers per the disclosure. Generally speaking, any suitable mechanism may be used to disable a functional circuit block.

Platforms for Configurable IC/SoC:

FIG. 5 is a product matrix illustrating the use of a particular design of one embodiment of an IC/SoC in different platforms. In the embodiment shown, product matrix 500 illustrates the different configurations in which an embodiment of an IC/SoC may be used in the following products: a tablet computer, a high-end smartphone, a mid-range smartphone, an entry-level smartphone, a high-performance desktop personal computer (PC), a mid-range desktop PC, a television set top box, a monitor/TV (e.g., a smart monitor or smart TV), and a laptop PC. The functional circuit blocks that may be enabled/disabled in this example include a CPU complex (having one or more processor cores), a GPU complex, an image system processing/camera circuit, an external display circuit, an internal display circuit, and a memory controller circuit (MCC).

It is noted that the product matrix is shown here by way of example and is not intended to be limiting. Accordingly, embodiments of an IC/SoC configurable for use in a different range of products than that shown here are possible and contemplated. Similarly, embodiments of an IC having a different range of functional circuit blocks that may be enabled or disabled are also possible and contemplated.

In the illustrated example, the embodiment of an IC is configured differently for each of the different products in which it may be used. For example, in a table computer, the full functionality of all functional circuit blocks is utilized, while a high-end phone utilizes most of the functional circuit blocks but does not support an external display. Several of the products, such as a mid-level phone, a mid-level desktop PC, and a set top box, among other utilize only a partial portion of the CPU complex. Thus, some of the processor cores are disabled in these products. It is noted that, relative to one another of the products in the matrix, different ones of the processor cores may be disabled. For example, some products may utilize at least one high performance processor core and at least one processor core optimized for energy efficiency, while other products may optimize only the efficient cores.

Other factors, such as thermal profiles, may be taken into consideration when determining which of the particular processor cores, GPU cores, and other portions of a particular functional circuit to disable. For example, referring back to CPU block 203 of FIG. 2, there are four processor cores 211 and 212 arranged in a square orientation (two columns, one each for the two different types of processor cores). If the designated system configuration calls for the enabling of only one of processor cores 211 and one of processor cores 212, and all are fully functional (as determined by a manufacturing test), the cores that remain enabled may be diagonally oriented with respect to one another. This may in turn minimize the adjacent dimensions of the two enabled cores, as they are closest to one another at only one corner each. As a result, the amount of heat shared between the two enabled cores during operation may be less than they would be in an arrangement wherein, e.g., two cores in the same row were chosen to remain enabled. This may make easier the dispersion of excess heat away from the cores, and thus simplify overall thermal control on the chip.

Performance considerations could also be a factor in determining which functional circuit blocks are to remain enabled. For example, if certain ones of the GPU cores are to be disabled, the remaining, enabled cores may be chosen based on performance metrics that were gathered in a manufacturing test, thereby choosing the highest performing ones.

Returning to the example of FIG. 5, ISP/camera circuitry may be disabled for products that do not utilize a camera, such as a desktop PC, a set top box, and a monitor/TV, among others. For a tablet and a high-end phone, the full functionality of the ISP/camera may be provided, while partial functionality is provided for the mid- and entry-level phones.

Generally speaking, various embodiments of an IC/SoC according to the disclosure may be used in a wide variety of different products that implement a common computing architecture. Particular instances of the IC/SoC may be configured according to the desired capabilities of those products, with unneeded capabilities disabled as discussed elsewhere herein. By utilizing a common computing architecture, the various ones of the products that utilize an instance (or more than one) of the IC/SoC may work seamlessly with one another for cross-platform communication.

Figure 6:
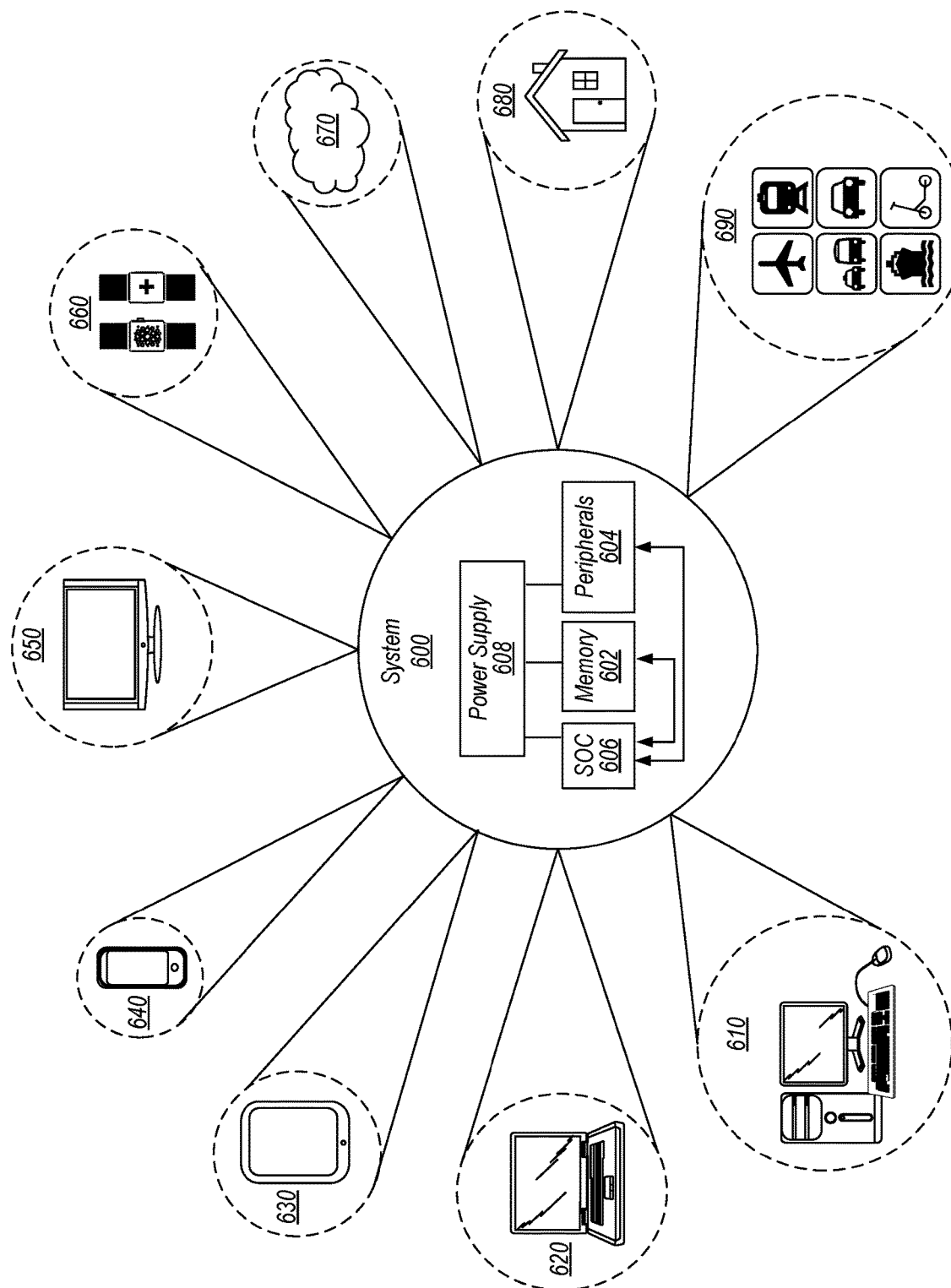
FIG. 6 is a block diagram illustrating different platforms for which an embodiment of an IC/SoC may be implemented.

Turning next to FIG. 6, a diagram illustrating examples of different computing platforms per the present disclosure. System 600 in the embodiment shown is a computing platform that may incorporate and/or otherwise utilize the methods and mechanisms described herein. In the illustrated embodiment, the system 600 includes at least one instance of a system on a chip (SoC) 606 which may include multiple types of processing units, such as one or more CPU cores, a GPU having a number of graphic processing cores, a communications fabric, and interfaces to memories and input/output devices. In some embodiments, one or more processors in SoC 606 includes multiple execution lanes and an instruction issue queue. SoC 606 may implement a common computing architecture (e.g., one that uses the same instruction set architecture) across the variety of different platforms shown here. In various embodiments, SoC 606 is coupled to external memory 602, peripherals 604, and power supply 608. In some system embodiments, multiple instances of SoC 606 may be combined to form a common computing element. It is further noted that, as an alternative to an SoC, the various functional circuit blocks may be implemented on multiple ICs, and these ICs may be combined into a single package as part of the implementation of the system.

A power supply 608 is also provided which supplies the supply voltages to SoC 606 as well as one or more supply voltages to the memory 602 and/or the peripherals 604. In various embodiments, power supply 608 represents a battery (e.g., a rechargeable battery in a smartphone, laptop or tablet computer, or other device). In some embodiments, more than one instance of SoC 606 is included (and more than one external memory 602 is included as well).

The memory 602 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

SoC 606 in the embodiment shown may be arranged in accordance with various other SoCs/ICs discussed above. That is, SoC 606 may implement a common functional architecture that can be used in each of the different system embodiments shown in FIG. 6. Thus, SoC 606 may also be arranged to disable certain functional circuit blocks therein in accordance with the particular system in which it is implemented. For example, a first set of functional circuit blocks may be disabled for an instance of SoC 606 that is implemented in a smartwatch 660, while a second set of functional circuit blocks may be disabled for another instance of SoC 606 implemented in desktop computer 610.

The disabling of various functional circuit blocks in a particular instance of SoC 606 may be carried out using programmable registers per the discussion above. Some of the registers may be programmed in response to a functional test of SoC 606 that occurs at the end of a manufacturing line. Based on any failed functional circuit blocks, a given instance of SoC 606 may be eliminated from possible use in certain ones of the system embodiments shown here. For example, if a functional circuit block including RF circuitry to support cellular communications fails test, the corresponding SoC 606 may be eliminated from possible use in mobile phone 640 and some embodiments of tablet computer 630. However, although no cellular communications may be possible for that particular instance of SoC 606, it may (depending on the test results of other functional circuit blocks) be available for use in other system embodiments, such as desktop computer 610, laptop computer 620, and monitor 650, among other examples.

After eliminating a given instance of SoC 606 for use in some platforms due to failing functional circuit blocks, it may then be designated to be used in a particular one of the systems still available thereto. However, since there might be additional functional circuit blocks that are unneeded, configuration registers may be used to disable them. Using the example of a failing RF circuit block for cellular communications given above, an instance of SoC 606 that has encountered this failure may be designated for use in desktop computer 610. However, since desktop computer 610 does not perform image system processing to support an onboard camera, a functional circuit block comprising an image system processor may also be disabled. This may be accomplished by boot code or a signature associated therewith that causes configuration registers to be programmed on a cold boot. Accordingly, any time such an embodiment of desktop computer 610 performs a system startup, the configuration registers may be programmed to disable the image system processor. Additionally, some connections to the disabled functional circuit blocks from always on circuitry may also be disabled. Similarly, connections to provide a clock signal to disabled functional circuits may themselves be disabled. Accordingly, starting from an architecture in which the design of SoC 606 may be applicable to all the platforms shown in FIG. 6 (as well as others that are possible and contemplated), a given instance thereof may be configured for use in one of the particular systems such that it provides the functionality necessary for that platform, while functionality that is not needed for the given platform is disabled.

The peripherals 604 include any desired circuitry, depending on the type of system 600. For example, in one embodiment, peripherals 604 includes devices for various types of wireless communication, such as Wi-Fi, Bluetooth, cellular, global positioning system, etc. In some embodiments, the peripherals 604 also include additional storage, including RAM storage, solid state storage, or disk storage. The peripherals 604 include user interface devices such as a display screen, including touch display screens or multi-touch display screens, keyboard or other input devices, microphones, speakers, etc.

As illustrated, system 600 is shown to have application in a wide range of areas. For example, system 600 may be utilized as part of the chips, circuitry, components, etc., of a desktop computer 610, laptop computer 620, tablet computer 630, cellular or mobile phone 640, or television 650 (or set-top box coupled to a television). Also illustrated is a smartwatch and health monitoring device 660. In some embodiments, smartwatch 660 may include a variety of general-purpose computing related functions. For example, smartwatch 660 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 600 may further be used as part of a cloud-based service(s) 670. For example, the previously mentioned devices, and/or other devices, may access computing resources in the cloud (i.e., remotely located hardware and/or software resources). Still further, system 600 may be utilized in one or more devices of a home system 680 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 6 is the application of system 600 to various modes of transportation. For example, system 600 may be used as a vehicular system 690 in the control and/or entertainment systems of aircraft, trains, buses, cars for hire, private automobiles, waterborne vessels from private boats to cruise liners, scooters (for rent or owned), and so on. In various cases, system 600 may be used to provide automated guidance (e.g., self-driving vehicles), general systems control, and otherwise. These any many other embodiments are possible and are contemplated. It is noted that the devices and applications illustrated in FIG. 6 are illustrative only and are not intended to be limiting. Other devices are possible and are contemplated.

Figure 7:
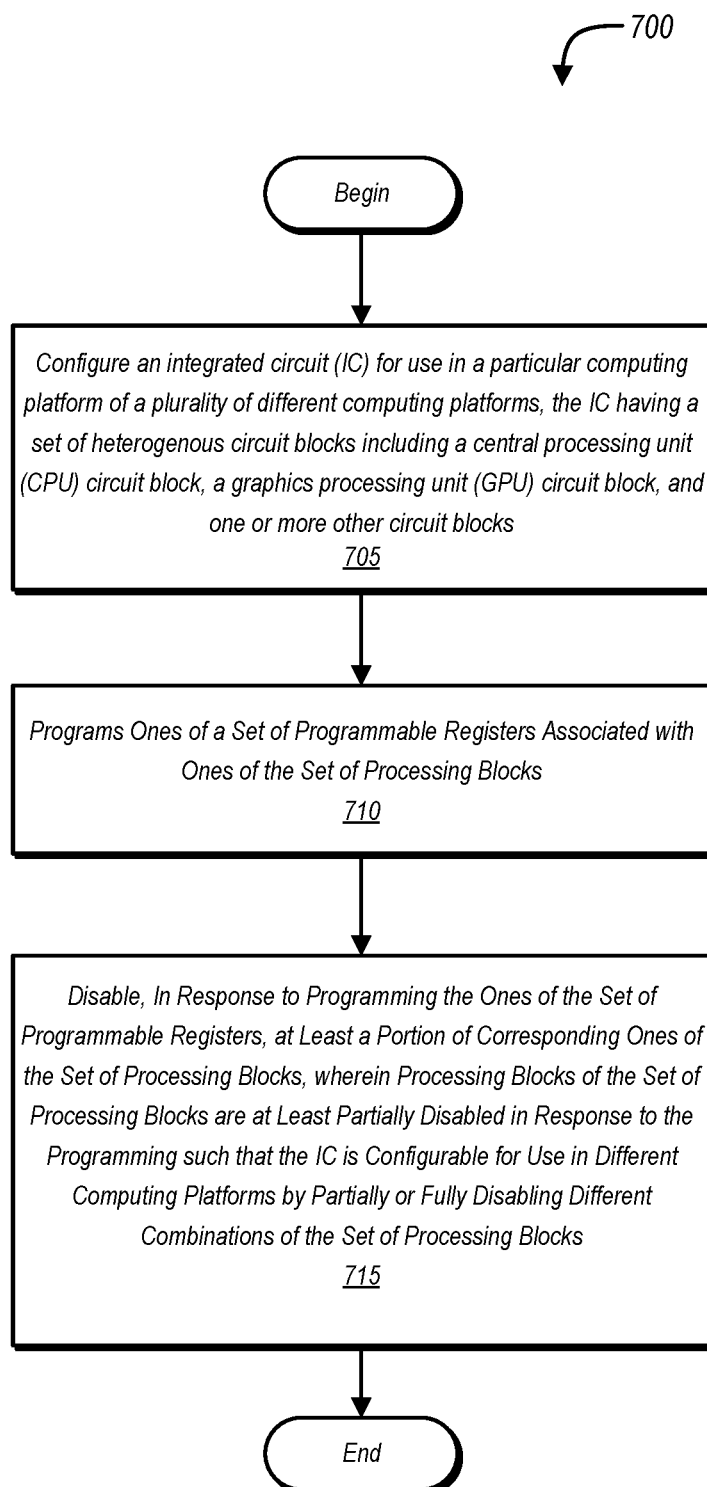
FIG. 7 is a flow diagram of one embodiment of a method for configuring an IC for use in a particular platform.

Methods for Configuring and Operating an IC:

FIG. 7 is a flow diagram of one embodiment of a method for configuring an IC for use in a particular one of a number of different platforms in which it may be implemented. The various different platforms may share a common architecture, and thus a particular instance of an IC per this disclosure may configured for use in any. Accordingly, Method 700 contemplates the use of an IC/SoC as disclosed herein. Embodiments of an IC/SoC not explicitly disclosed herein, but otherwise configurable per Method 700 are also considered to fall within the scope of this disclosure.

Method 700 includes configuring an integrated circuit (IC) for use in a particular computing platform of a plurality of different computing platforms, the IC having a set of processing blocks including a central processing unit (CPU) circuit block, a graphics processing unit (GPU) circuit block, and one or more other circuit blocks (block 705). The configuring includes programming ones of a set of programmable registers associated with ones of the set of processing blocks (block 710). The configuring further includes disabling, in response to programming the ones of the set of programmable registers, at least a portion of corresponding ones of the set of processing blocks, wherein processing blocks of the set of processing blocks are at least partially disabled in response to the programming such that the IC is configurable for use in different computing platforms by partially or fully disabling different combinations of the set of processing blocks (block 715). At least two of the different computing platforms support different sets of peripherals. Furthermore, the particular computing platform supports a unique set of peripherals with respect to other ones of the plurality of computing platforms.

In one embodiment, the method includes configuring a first instance of the IC for use in a tablet computer having a first set of peripherals, the first set of peripherals including an internal display peripheral and an external display peripheral. This method embodiment further includes configuring a second instance of the IC for use in a media player having a second set of peripherals different from the first, wherein configuring the second instance includes partially disabling the CPU circuit block and fully disabling a display pipeline circuit block dedicated to an external display, and further includes disabling an image signal processing circuit block for a camera. Embodiments of the method may also include configuring the IC for use in one of a plurality of different performance classes of a given one of the plurality of computing platforms by selectively disabling portions of the set of heterogeneous processing blocks for the one of the plurality of different performance classes In some embodiments, the method includes inhibiting a clock signal from being provided to a given one of the set of processing blocks in response to programming a corresponding first one of the set of programmable registers. Such embodiments may also include inhibiting power from being provided to the given one of the set of processing blocks in response to programming a corresponding second one of the set of programmable registers.

In one embodiment, an IC includes an always-on circuit configured to remain operating when the IC is receiving power. Embodiments of a method involving an IC with an always-on circuit include severing, in response to programming a corresponding one of the programmable registers, at least one communications link between the always on circuit and a corresponding one of the set of processing blocks.

Various method embodiments include performing, upon a boot of a computing platform that includes the IC, one or more tasks that utilize a given processing block. These method embodiments include disabling, upon completion of the one or more tasks and based upon a given programmable register being set, at least a portion of the given processing block from being accessed by software.

With regard to the programmable registers, a given programmable register is a one-time programmable register such that the given programmable register cannot be cleared once set.

Figure 8:
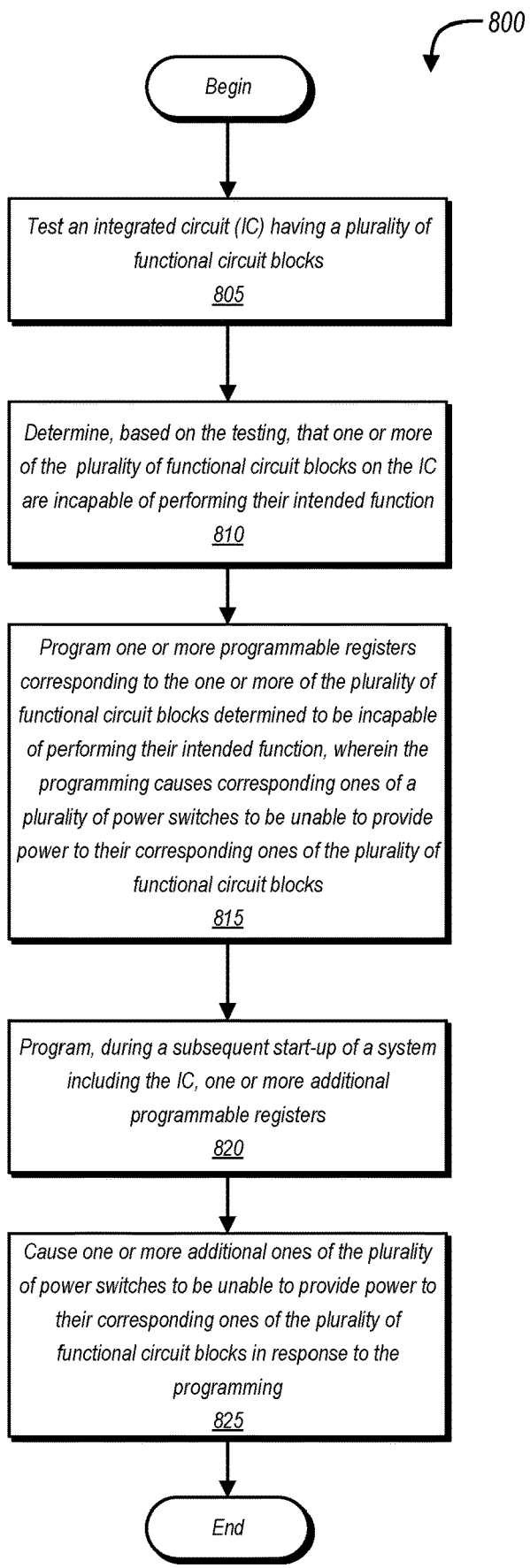
FIG. 8 is a flow diagram of another embodiment of a method for configuring an IC for use in a particular platform.

FIG. 8 is a flow diagram of another embodiment of a method for configuring an IC for use in a particular platform. Method 800 may be carried out for any embodiment of an IC/SoC as disclosed herein. Embodiments of an IC/SoC that may be configured in accordance with Method 800 are also considered to fall within the scope of this disclosure.

Method 800 includes testing an IC having a plurality of functional circuit blocks (block 805). The IC may be designed such that it can be used in a wide variety of platforms with significantly different requirements. For example, the IC may be an SoC having a computing architecture applicable to an variety of platforms including a smartwatch, smartphone, desktop computer, server, and so on. At least some of these platforms may utilize a different combination of functional circuit blocks than others, including different sets of peripherals and different ones of a set of processing circuit blocks.

The method further includes determining, based on the testing, that one or more functional circuit blocks on the IC are incapable of performing their intended function (block 810). After making this determination, the method includes programming one or more programmable registers corresponding to the one or more of the plurality of functional circuit blocks determined to be incapable of performing their intended function (block 815). The programming of the one or more programmable registers causes corresponding ones of a plurality of power switches to be unable to provide power to their corresponding ones of the plurality of functional circuit blocks.

The programming of programmable registers to inhibit a functional circuit block (or portion thereof) from receiving power is but one possible mechanism for carrying out the disabling. Disabling a functional circuit block in accordance with this disclosure may include inhibiting a clock signal from being provided to the functional circuit block, and may also include inhibiting it from receiving certain signals.

Since some functional circuit blocks that passed test may be unneeded for the intended platform of the IC, the method further includes programming, during a subsequent start-up of a system including the IC, one or more additional programmable registers (block 820) and causing one or more additional ones of the plurality of power switches to be unable to provide power to their corresponding ones of the plurality of functional circuit blocks in response to the programming (block 825). Accordingly, the unneeded but otherwise capable functional circuit blocks are also disabled.

Generally speaking, the disclosure contemplates that every single power and clock domain of the IC includes at least one programmable register (or bit thereof) corresponding thereto to allow disabling of various functional circuitry that is incapable of performing its intended function and/or otherwise unneeded for a particular platform. Since this may include clock domains, the IC may include programmable registers that cause a clock signal to be either disabled or inhibited from being provided to a disabled functional circuit block. The programmable registers in various embodiments may be one-time programmable switches of limited programmability. Thus, the programmable registers may be programmed to disable a functional circuit block, but once set, are unable to be reprogrammed to enable that same functional circuit block. In various embodiments, the default state of various programmable registers is to enable its corresponding functional circuit block (or portion thereof), with the programmed state being used to disable the same.

The disclosure also contemplates situations where all functional circuits on an instance of an IC pass test and, initially, are still fully enabled initially thereafter. After selection of the particular platform for that instance of the IC, the unneeded functional circuit blocks may be disabled by programming the programmable registers as discussed herein.

The programmable registers may be implemented in various ways. In general, a programmable register may be a register that, when programmed (or set) causes a corresponding power switch to be opened, causes a clock signal to be inhibited, or some other action that renders a corresponding functional circuit block unable to fully or even partially operate. In some embodiments, at least one programmable register may be implemented using at least one fuse. A programmable register may also be implemented as a device that, when programmed, causes a terminal or node thereof to be tied to a particular voltage level or voltage rail. Various programmable read-only memory circuit structures may also be used to implement the programmable registers.

Figure 9:
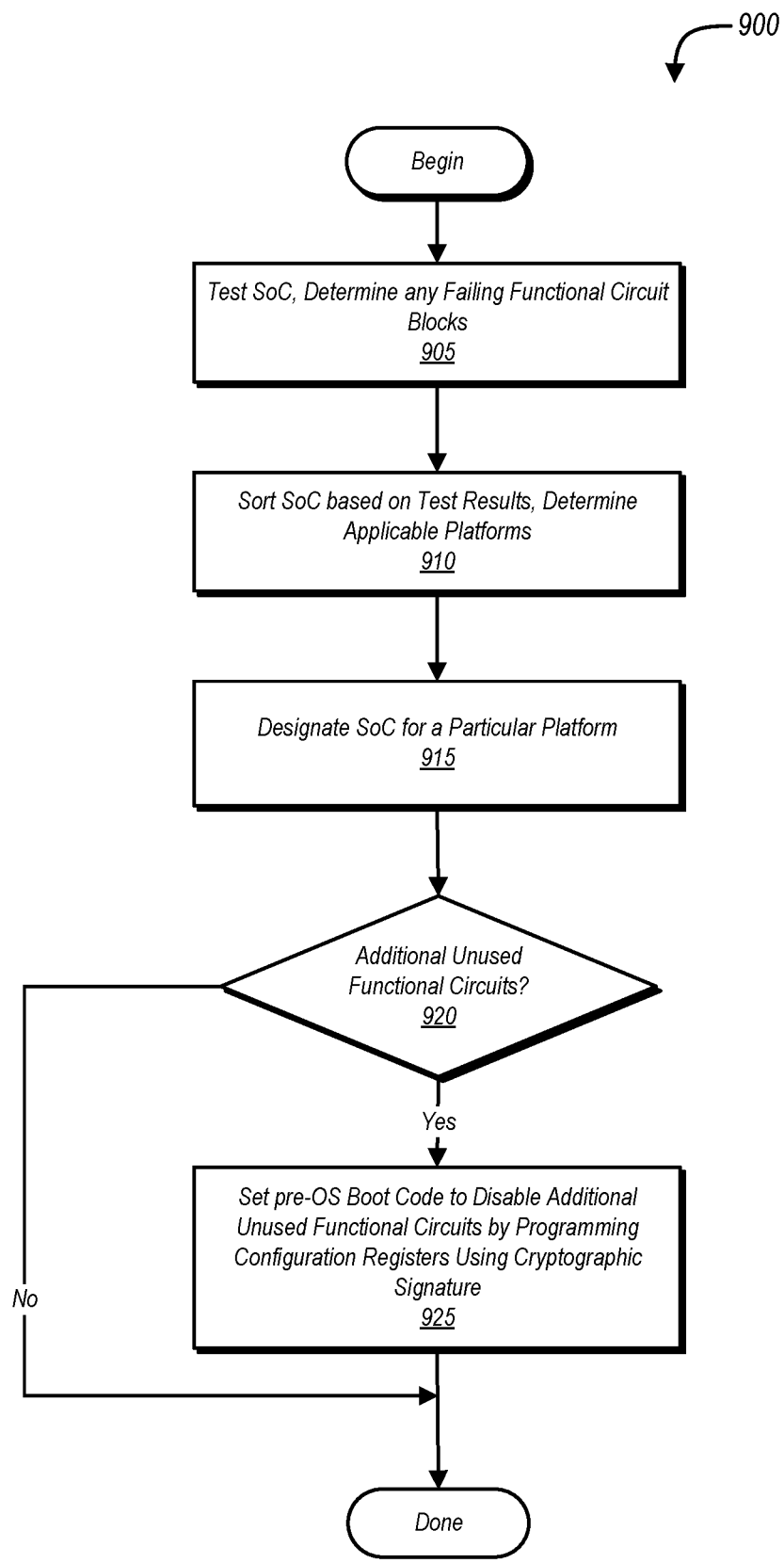
FIG. 9 is a flow diagram of another embodiment of a method for configuring an IC for use in a particular platform.

FIG. 9 is a flow diagram of one embodiment of a method for configuring an SoC for a particular platform. Method 900 may be carried out for any embodiment of an IC/SoC according to this disclosure. Embodiments of an IC/SoC that may be configured in accordance with Method 900, but not otherwise disclosed herein, are also considered to fall within the scope of this disclosure.

Method 900 includes testing the SoC and determining any failing functional circuit blocks (block 905). Thereafter, the SoC may be sorted, along with other instances thereof, based on the test results, to determine applicable platforms in which it may be used (block 910). Assuming the SoC does not have any fatal failures (i.e. failures that would render it unusable in any platform), it is then designated for a particular platform (block 915). This designation may be made in part based on which functional circuit blocks failed test, although other factors (e.g., product demand) may also be considered. After this designation, a determination is made as to whether there are any functional circuit blocks on the SoC that passed test (and are thus fully capable of carrying out their intended functions) that are otherwise unused in the particular platform. If no (block 920, no), the method is completed. Otherwise, if there are additional unused functional circuit blocks in the SoC (block 920, yes), pre-OS boot code may be set (e.g., via a cryptographic signature or other suitable mechanism) to disable additional unused functional circuit blocks by programming configuration registers during a system cold boot procedure (block 925).

Figure 10:
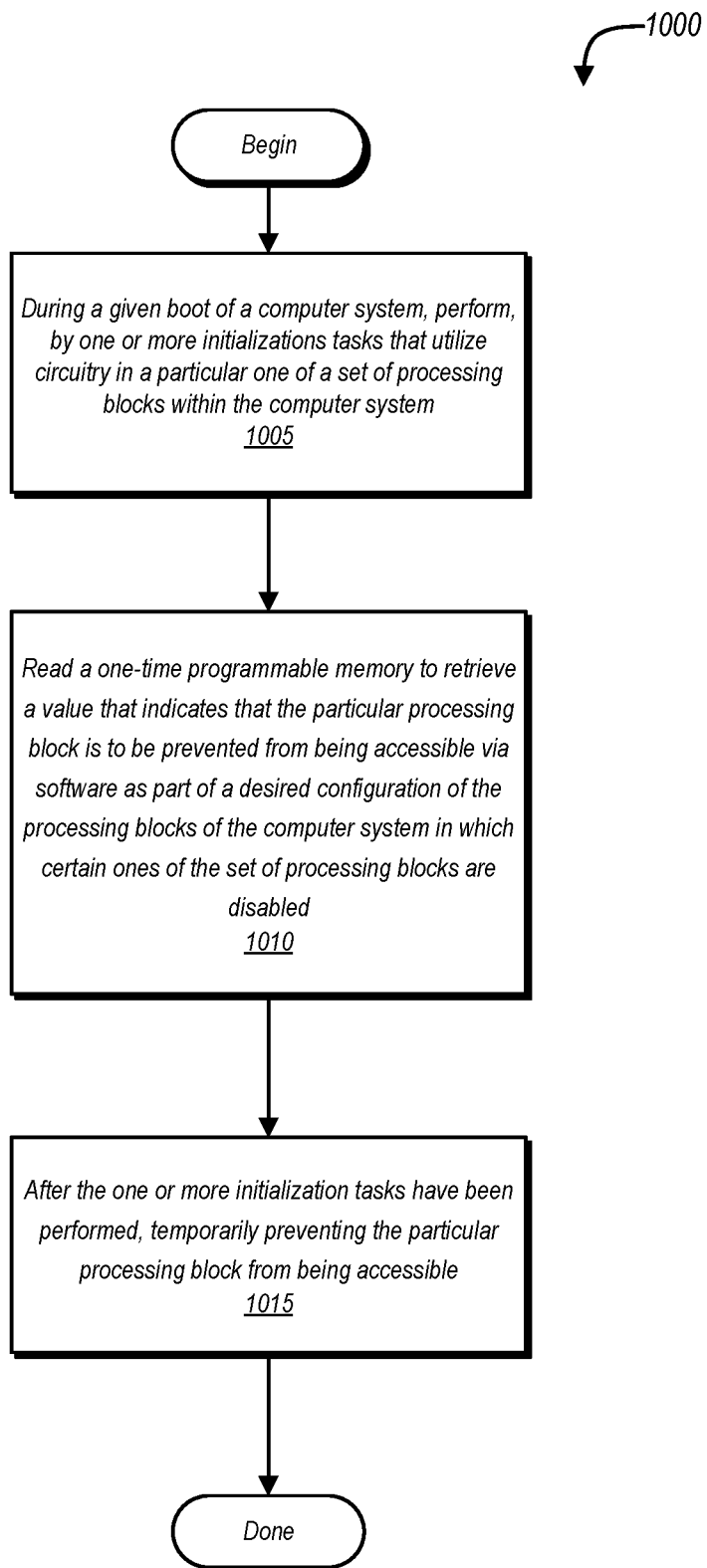
FIG. 10 is a flow diagram of an embodiment of performing a cold boot in a system and subsequently disabling certain functional circuit blocks.

FIG. 10 is a flow diagram of an embodiment of a method for allowing limited use of functional circuit blocks during a cold-boot before their subsequent disablement. Method 1000 may be carried out by any of the IC/SoC and other hardware embodiments disclosed herein. An embodiment of an IC, SoC, or system capable of carrying out Method 1000, but not otherwise disclosed herein, is considered to fall within the scope of this disclosure.

Method 1000 includes, during a given boot of a computer system, performing, by one or more initializations tasks that utilize circuitry in a particular one of a set of processing blocks within the computer system (block 1005). In various embodiments, the boot may be a cold boot in which the system been powered on from a powered off state. The tasks may be various tasks that are carried out during initialization of the system from a powered down state. For example, carrying out testing using BIST circuitry implemented various processing blocks of the system and conveying those results to a main BIST controller may occur at this time. The method further includes reading a one-time programmable memory to retrieve a value that indicates that the particular processing block is to be prevented from being accessible via software as part of a desired configuration of the processing blocks of the computer system in which certain ones of the set of processing blocks are disabled (block 1010). The one-time programmable memory may comprise a plurality of programmable registers, wherein a given programmable register includes at least one storage location for a corresponding processing block in the system. The processing blocks may include various types of functional circuits, including CPU circuits, GPU circuits, various types of peripheral circuits, interface circuits, and so on. The method further includes, after the one or more initialization tasks have been performed, temporarily preventing the particular processing block from being accessible (block 1015). Disabling a given processing block may comprise inhibiting power from being provided thereto, inhibiting a clock from being provided thereto, and/or inhibiting various signals from being transmitted thereto. In one embodiment, temporarily preventing the particular processing block from being accessible occurs until a subsequent boot of the computer system, after which Method 1000 repeats. The various operations of Method 1000 may be carried out prior to beginning the loading of operating system software that runs on the computer system. Accordingly, the disabled processing blocks are not visible to the operating system software.

Various embodiments of the method include receiving a harvesting command that writes the one-time programmable memory with the value in order to set the desired configuration to a specified one of a plurality of different computing platforms, at least two of which support different sets of peripherals. The harvesting command in various embodiments may be received from a source internal to the computer system. For example, one embodiment is contemplated in which a signature (which may be cryptographic) is stored in a non-volatile memory indicating the platform and/or the specific configuration in which the system is to operate.

Method 1000 may be carried out for a wide variety of different computing platforms. In one embodiment, a plurality of computing platforms for which Method 100 may be carried out includes a television set top box. When the computing platform is a television set top box, the method include disabling an internal display interface circuit for the television set top box in response to receiving the harvesting command, as the set top box does not include an internal display. Other processing blocks (such as an image system processor for a camera) may also be disabled in this embodiment. When the computing platform is a smart phone, the method includes disabling an external display interface circuit in response to receiving the harvesting command, as the smart phone utilizes an internal display.

Figure 11:
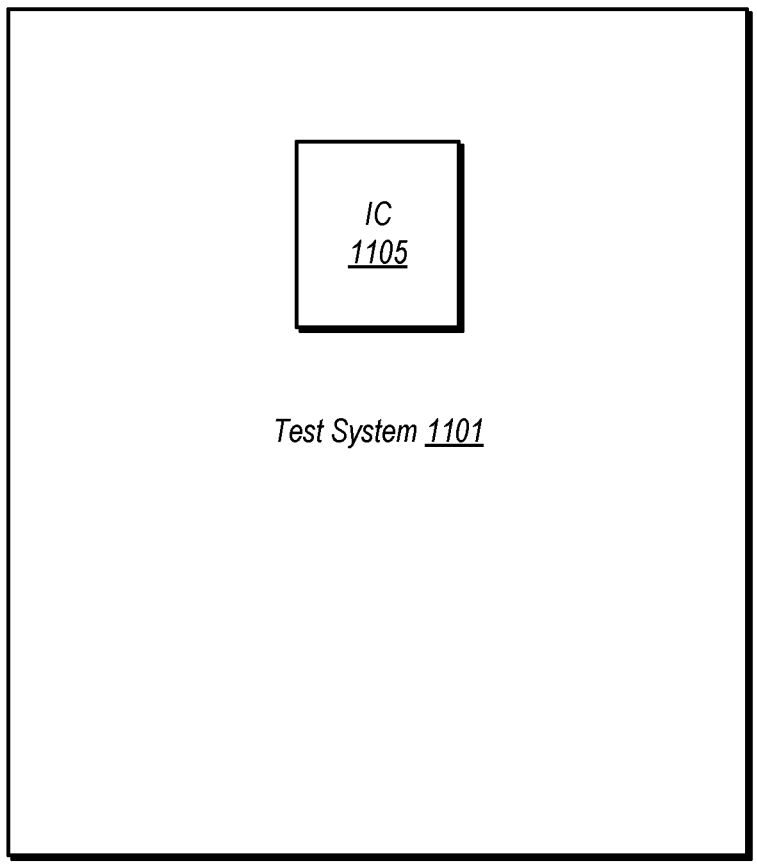
FIG. 11 is a block diagram of one embodiment of a test system.

IC Test System:

FIG. 11 is a block diagram of one embodiment of an IC test system. In the embodiment shown test system 1101 may be used to test IC 1105, which may be an IC in accordance with any of the IC/SoC embodiments discussed elsewhere herein. Test system 1101 may conduct an end-of-line manufacturing test of IC 1105 to verify its functionality and further, to determine any functional circuit blocks that do not function per specifications.

To test IC 1105, test system 1101 may apply various stimuli in the form of analog and/or digital (logic) signals.

IC 1105 may return output signals that are then compared to expected responses. A failing functional block may return output signals that are different than that which is expected and/or having values outside of some specified range.

In some embodiments, test system 1101 may be configured to place IC 1105 into a programming mode. When in the programming mode, test system 1101 may program at least portions of a read-only memory (ROM) in IC 1105 that stores a signature indicative of its intended system configuration. This programming may indicate which functional circuit blocks of IC 1105, if any, failed test and are thus unusable. In doing so, this may eliminate IC 1105 from being considered for use in some computing platforms, although it may be suitable for others. It is noted that the programming may not be complete at this point, as it may only account for failed functional circuit blocks, but not for any additional circuit blocks that are to be disabled for the computing platform in which it is eventually implemented. It is noted that in some embodiments, IC 1105 may include fuses, and thus carrying out programming in the programming mode may include blowing fuses. In embodiments that do not utilize fuses, other mechanisms, such as the ROM discussed above, may be used.

Figure 12:
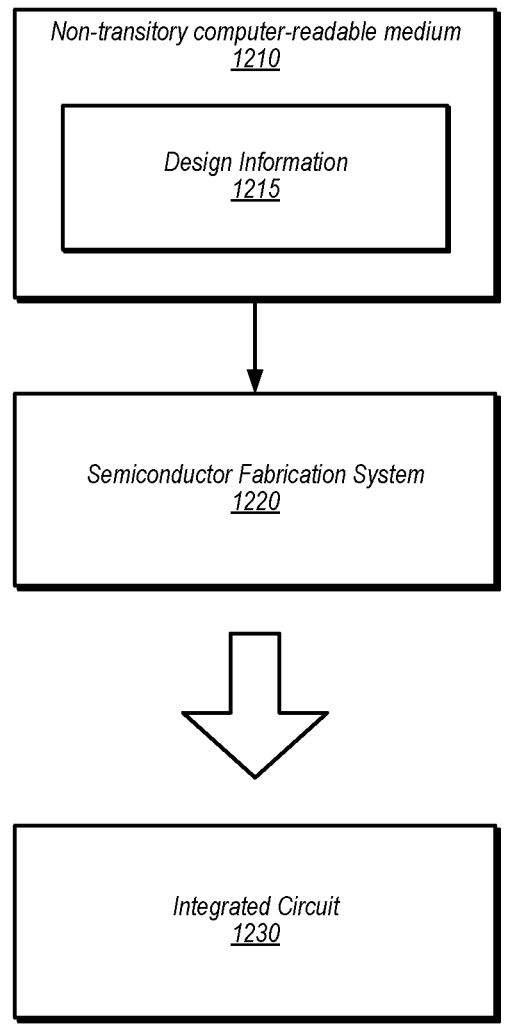
FIG. 12 is a block diagram of one embodiment of a computer readable medium and a fabrication system for fabricating a circuit according to the disclosure.

Computer Readable Medium and Fabrication System:

FIG. 12 a block diagram illustrating an example of a non-transitory computer-readable storage medium that stores circuit design information, according to some embodiments. In the illustrated embodiment, semiconductor fabrication system 1220 is configured to process the design information 1215 stored on non-transitory computer-readable storage medium 1210 and fabricate integrated circuit 1230 based on the design information 1215. Such a system may be used to manufacture an IC/SoC in accordance with this disclosure.

Non-transitory computer-readable storage medium 1210 may comprise any of various appropriate types of memory devices or storage devices. Non-transitory computer-readable storage medium 1210 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1210 may include other types of non-transitory memory as well or combinations thereof. Non-transitory computer-readable storage medium 1210 may include two or more memory mediums, which may reside in different locations, e.g., in different computer systems that are connected over a network.

Design information 1215 may be specified using any of various appropriate computer languages, including hardware description languages such as, without limitation: VHDL, Verilog, SystemC, SystemVerilog, RHDL, M, MyHDL, etc. Design information 1215 may be usable by semiconductor fabrication system 1220 to fabricate at least a portion of integrated circuit 1230. The format of design information 1215 may be recognized by at least one semiconductor fabrication system, such as semiconductor fabrication system 1220, for example. In some embodiments, design information 1215 may include a netlist that specifies elements of a cell library, as well as their connectivity. One or more cell libraries used during logic synthesis of circuits included in integrated circuit 1230 may also be included in design information 1215. Such cell libraries may include information indicative of device or transistor level netlists, mask design data, characterization data, and the like, of cells included in the cell library.

Integrated circuit 1230 may, in various embodiments, include one or more custom macrocells, such as memories, analog or mixed-signal circuits, and the like. In such cases, design information 1215 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1220 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1220 may also be configured to perform various testing of fabricated circuits for correct operation.

In various embodiments, integrated circuit 1230 is configured to operate according to a circuit design specified by design information 1215, which may include performing any of the functionality described herein. For example, integrated circuit 1230 may include any of various elements shown or described herein. Further, integrated circuit 1230 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of U.S. patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a U.S. patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
   an integrated circuit (IC) having a set of processing blocks for a computer system that includes a central processing unit (CPU) circuit block, a graphics processing unit (GPU) circuit block, and one or more other circuit blocks, wherein the IC includes:
   a set of programmable registers associated with ones of the set of processing blocks, wherein the IC is configured to, when a given one of the set of programmable registers is set, disable a portion of a given one of the set of processing blocks; and
   wherein processing blocks in the set of processing blocks are configured to be at least partially disabled by setting ones of the set of programmable registers, such that the IC is configurable for use in different computing platforms by partially or fully disabling different combinations of the set of processing blocks; and
   wherein at least two of the different computing platforms support different sets of peripherals.

2. The apparatus of claim 1, wherein the different computing platforms includes a tablet computing platform for tablet computers having a first of peripherals, the first set of peripherals including an internal display peripheral and an external display peripheral.

3. The apparatus of claim 2, wherein the different computing platforms includes a media player computing platform for media player devices having a second set of peripherals different from the first set of peripherals, wherein the IC is configurable for use in the media player computing platform by partially disabling the CPU circuit block and fully disabling a display pipeline circuit block dedicated to an internal display and an image signal processing (ISP) circuit block for a camera.

4. The apparatus of claim 1, wherein the one or more other circuit blocks includes one or more of the following types of circuit blocks: an image signal processing (ISP) circuit block, a neural engine circuit block, an audio/video codec circuit block, a display pipeline circuit block.

5. The apparatus of claim 1, wherein the IC is configurable for use in different performance classes of a given one of the different computing platforms by selectively disabling portions of the set of processing blocks for the different performance classes.

6. The apparatus of claim 5, wherein the given one of the different computing platforms is a mobile phone platform, wherein the IC is configurable for use in a first performance class and a second performance class of the mobile phone platform by partially disabling the GPU circuit block for the second performance class but not the first performance class.

7. The apparatus of claim 1, wherein ones of the set of programmable registers are configured to, when programmed, cause one or more of the following:
   inhibit a clock signal from being provided to a corresponding one of the set of processing blocks;
   inhibit power from being provided to the corresponding one of the set of processing blocks.

8. The apparatus of claim 1, wherein the IC includes an always-on circuit configured to remain operating when the IC is receiving power, and wherein given one of the set of programmable registers is configured to, when programmed, sever at least one communications link between the always on circuit and a corresponding one of the set of processing blocks.

9. The apparatus of claim 1, wherein the different computing platforms include:
   a desktop computer;
   a laptop computer;
   a mobile phone;
   a tablet computer;
   a smart watch;
   a display unit;
   an internet-of-things (IoT) device; and
   a vehicle-based computing system.

10. The apparatus of claim 1, wherein the IC is configured, after each boot of the computer system, to:
    perform one or more tasks that utilize a given processing block; and
    disable, based on a given programmable register being set, the portion of the given processing block from being accessed by software.

11. The apparatus of claim 10, wherein the given programmable register is a one-time programmable register such that the given programmable register cannot be cleared once set.

12. A method comprising:
    configuring an integrated circuit (IC) for use in a particular computing platform of a plurality of different computing platforms, the IC having a set of processing blocks including a central processing unit (CPU) circuit block, a graphics processing unit (GPU) circuit block, and one or more other circuit blocks, wherein the configuring comprises:
    programming ones of a set of programmable registers associated with ones of the set of processing blocks; and
    disabling, in response to programming the ones of the set of programmable registers, at least a portion of corresponding ones of the set of processing blocks, wherein processing blocks of the set of processing blocks are at least partially disabled in response to the programming such that the IC is configurable for use in the plurality of different computing platforms by partially or fully disabling different combinations of the set of processing blocks; and
    wherein at least two of the plurality of different computing platforms support different sets of peripherals;
    wherein the particular computing platform supports a unique set of peripherals with respect to other ones of the plurality of different computing platforms.

13. The method of claim 12, further comprising:
    configuring a first instance of the IC for use in a tablet computer having a first of peripherals, the first set of peripherals including an internal display peripheral and an external display peripheral; and
    configuring a second instance of the IC for use in a media player having a second set of peripherals different from the first set of peripherals, wherein configuring the second instance includes partially disabling the CPU circuit block and fully disabling a display pipeline circuit block dedicated to an external display, and further includes disabling an image signal processing circuit block for a camera.

14. The method of claim 12 further comprising configuring the IC for use in one of a plurality of different performance classes of a given one of the plurality of different computing platforms by selectively disabling portions of the set of processing blocks for the one of the plurality of different performance classes.

15. The method of claim 12, further comprising:
inhibiting a clock signal from being provided to a given one of the set of processing blocks in response to programming a corresponding first one of the set of programmable registers; and
inhibiting power from being provided to the given one of the set of processing blocks in response to programming a corresponding second one of the set of programmable registers.

16. The method of claim 12, wherein the IC includes an always-on circuit configured to remain operating when the IC is receiving power, and wherein the method further comprises:
severing, in response to programming a corresponding one of the set of programmable registers, at least one communications link between the always-on circuit and a corresponding one of the set of processing blocks.

17. The method of claim 12, further comprising:
performing, upon a boot of a computing platform that includes the IC, one or more tasks that utilize a given processing block; and
disabling, upon completion of the one or more tasks and based upon a given programmable register being set, at least a portion of the given processing block from being accessed by software.

18. The method of claim 17, wherein the given programmable register is a one-time programmable register such that the given programmable register cannot be cleared once set.

19. An apparatus comprising:
an integrated circuit (IC) configurable for use in one of a plurality of computing platforms, the IC having a set of processing blocks that includes a central processing unit (CPU) circuit block, a graphics processing unit (GPU) circuit block, and one or more other circuit blocks implemented in corresponding ones of a plurality of power domains, wherein the IC further includes:
a plurality of power switches associated with corresponding ones of the plurality of power domains; and
a plurality of programmable registers, wherein ones of the plurality of programmable registers are associated with corresponding ones of the plurality of power switches, and wherein ones of the plurality of programmable registers, when programmed, are configured to cause corresponding ones of the plurality of power switches to remain open such that a corresponding one of the set of processing blocks is disabled;
wherein given ones of the plurality of programmable registers are one-time programmable registers that, once set, cannot be cleared; and
wherein the IC is configurable for use in different ones of the plurality of computing platforms by partially or fully disabling different combinations of the set of processing blocks, wherein at least two of the plurality of computing platforms support different sets of peripherals.

20. The apparatus of claim 19, wherein the plurality of computing platforms includes:
a desktop computer;
a laptop computer;
a mobile phone;
a tablet computer;
a smart watch;
a display unit;
a television set-top box;
an internet-of-things (IoT) device; and
a vehicle-based computing system.

* * * * *